United States Patent [19]
Tanzawa et al.

[11] Patent Number: 5,621,682
[45] Date of Patent: Apr. 15, 1997

[54] MEMORY SYSTEM

[75] Inventors: Toru Tanzawa, Ebina; Tomoharu Tanaka, Yokohama, both of Japan

[73] Assignee: Kabushiki Kaisha Toshiba, Kawasaki, Japan

[21] Appl. No.: 364,997

[22] Filed: Dec. 28, 1994

[30] Foreign Application Priority Data

Dec. 28, 1993 [JP] Japan ................................. 5-354152
Dec. 27, 1994 [JP] Japan ................................. 6-326344

[51] Int. Cl.$^6$ ................................................. G11C 11/34
[52] U.S. Cl. ............................ 365/185.03; 365/185.09; 371/40.1
[58] Field of Search ..................... 365/185.03, 185.09, 365/200; 37/40.1, 40.2

[56] References Cited

U.S. PATENT DOCUMENTS

| | | |
|---|---|---|
| 4,959,812 | 9/1990 | Momodomi et al. . |
| 5,043,940 | 8/1991 | Harari . |
| 5,268,870 | 12/1993 | Harari ................................. 365/185.03 |
| 5,424,898 | 6/1995 | Hagiwara et al. .................. 365/200 X |
| 5,450,363 | 9/1995 | Christopherson et al. ............. 365/205 |

FOREIGN PATENT DOCUMENTS 5-60199 9/1993 Japan .

OTHER PUBLICATIONS

*IEEE Journal of Solid–State Circuits*, "An Experimental Large–Capacity Semiconductor File Memory Using 16–Levels/Cell Storage." by Masashi Horiguchi, et al. vol. 23, No.1, Feb. 1988, pp. 27–32.

Primary Examiner—David C. Nelms
Assistant Examiner—Huan Hoang
Attorney, Agent, or Firm—Oblon, Spivak, McClelland, Maier & Neustadt, P.C.

[57] ABSTRACT

According to the present invention, a memory system comprises storing section having a plurality of memory elements each of which stores one of n-value storage states corresponding to data "0", "1", . . . , "n−1", and including a plurality of information memory elements for storing n-value information data and a plurality of check memory elements for storing check data, converting section for respectively converting the information data and the check data stored in the memory elements into binary codes having a plurality of bits each constituted by 0 or 1, the binary codes corresponding to the information data and the check data, and detecting/correcting section for detecting and correcting an error on the basis of the binary codes corresponding to the check data and the information data.

41 Claims, 25 Drawing Sheets

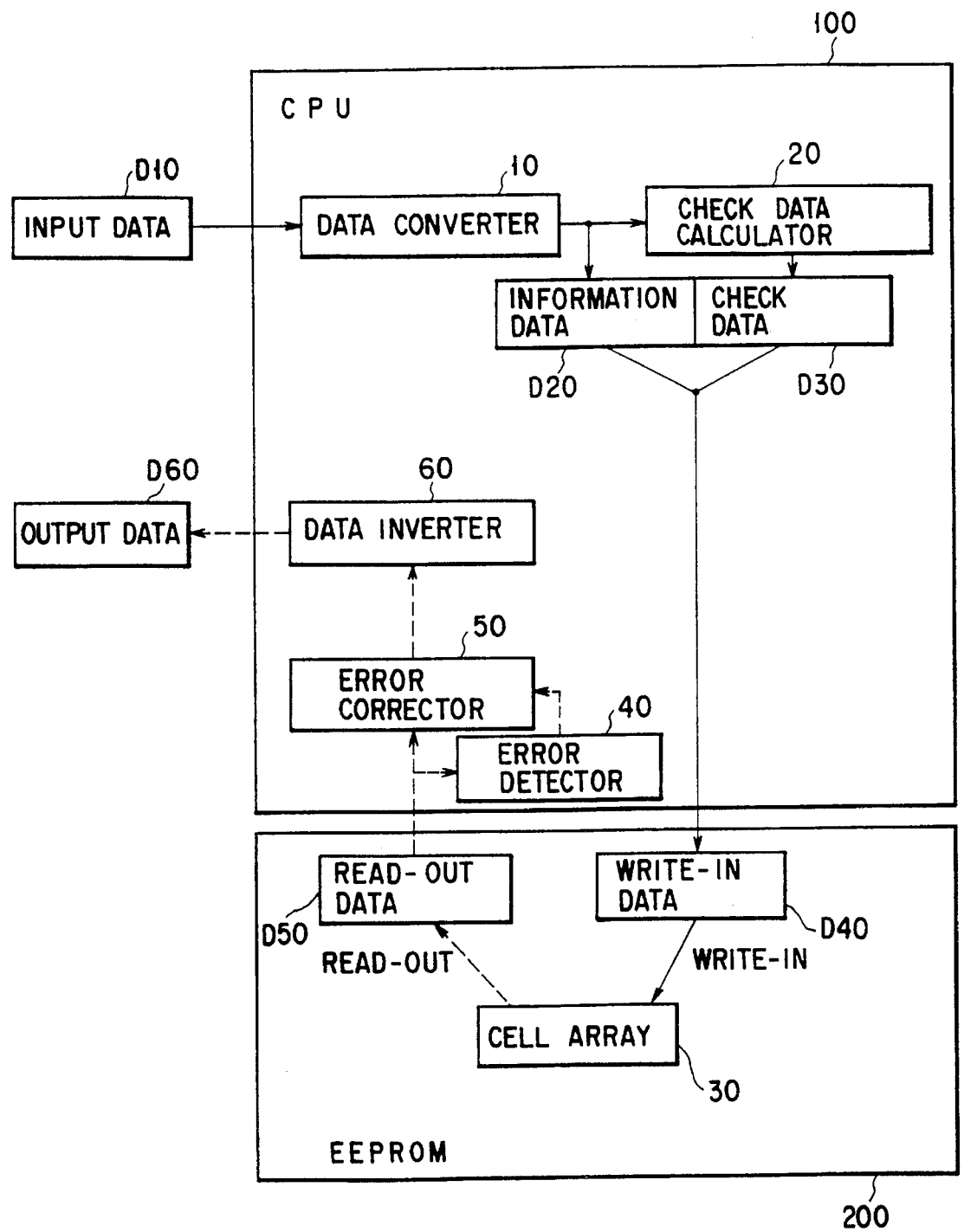
F I G. 7

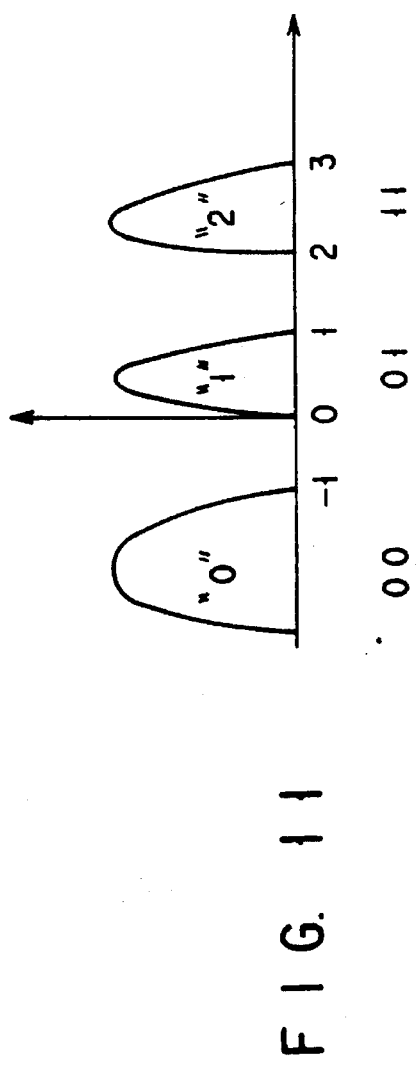
F I G. 11
F I G. 12

IO16 ———————————————— IO021

FIG. 22A WE 
FIG. 22B $IO_\ell$ ($\ell = 1 \sim 16$) 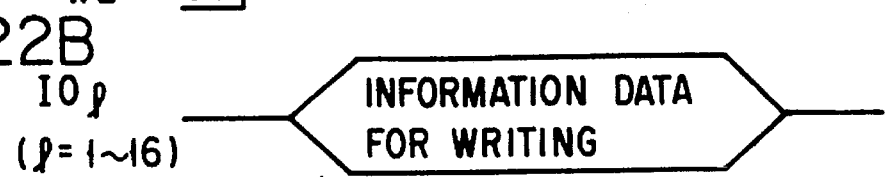
FIG. 22C $IOO_k$ ($k = 1 \sim 21$) $= IOI_k = O_k = I_k$ 
FIG. 22D $P_i$ ($i = 1 \sim 6$) 
FIG. 22E $CSL_n$ 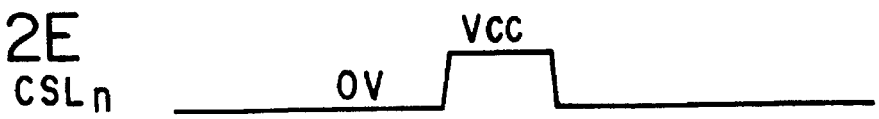

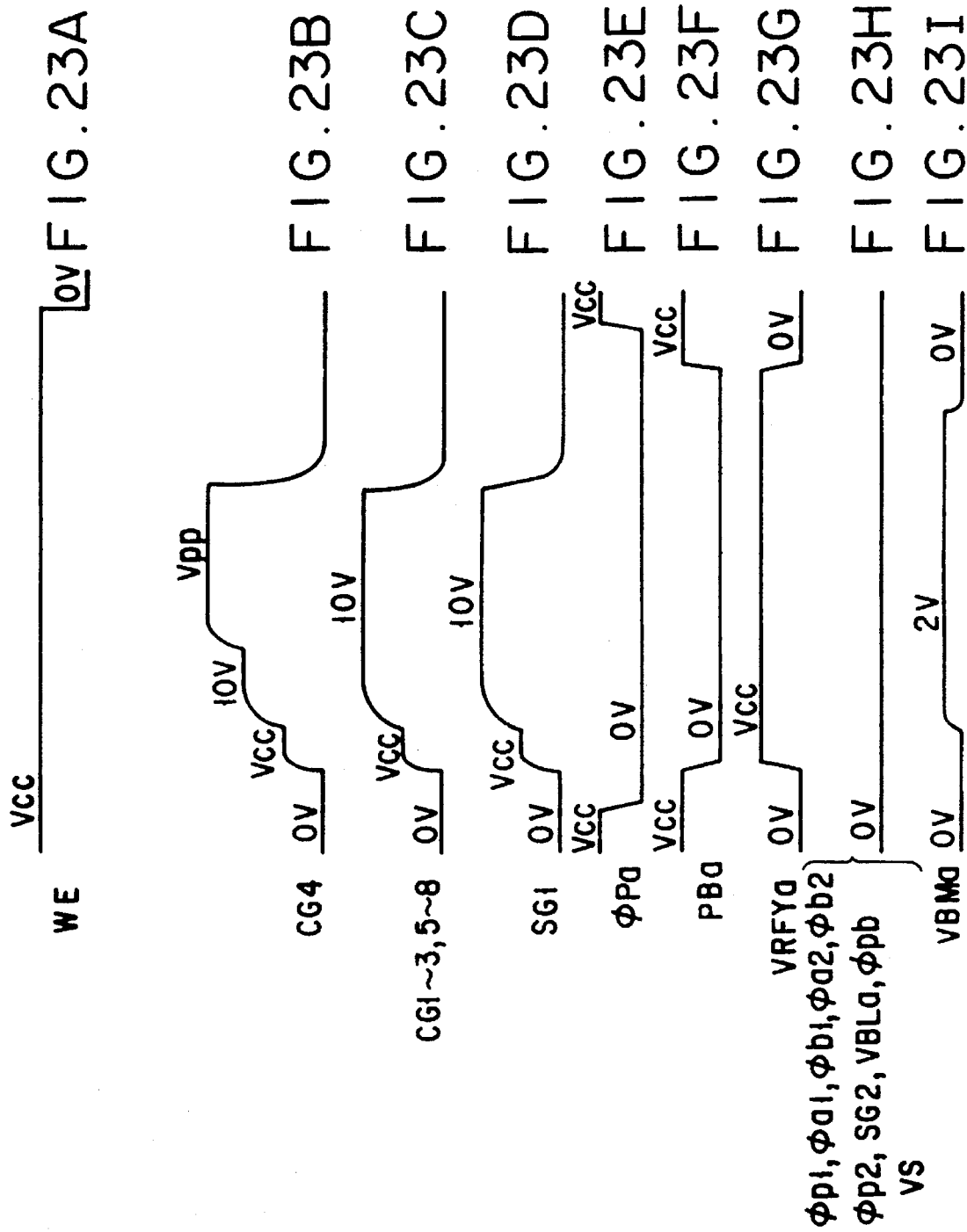

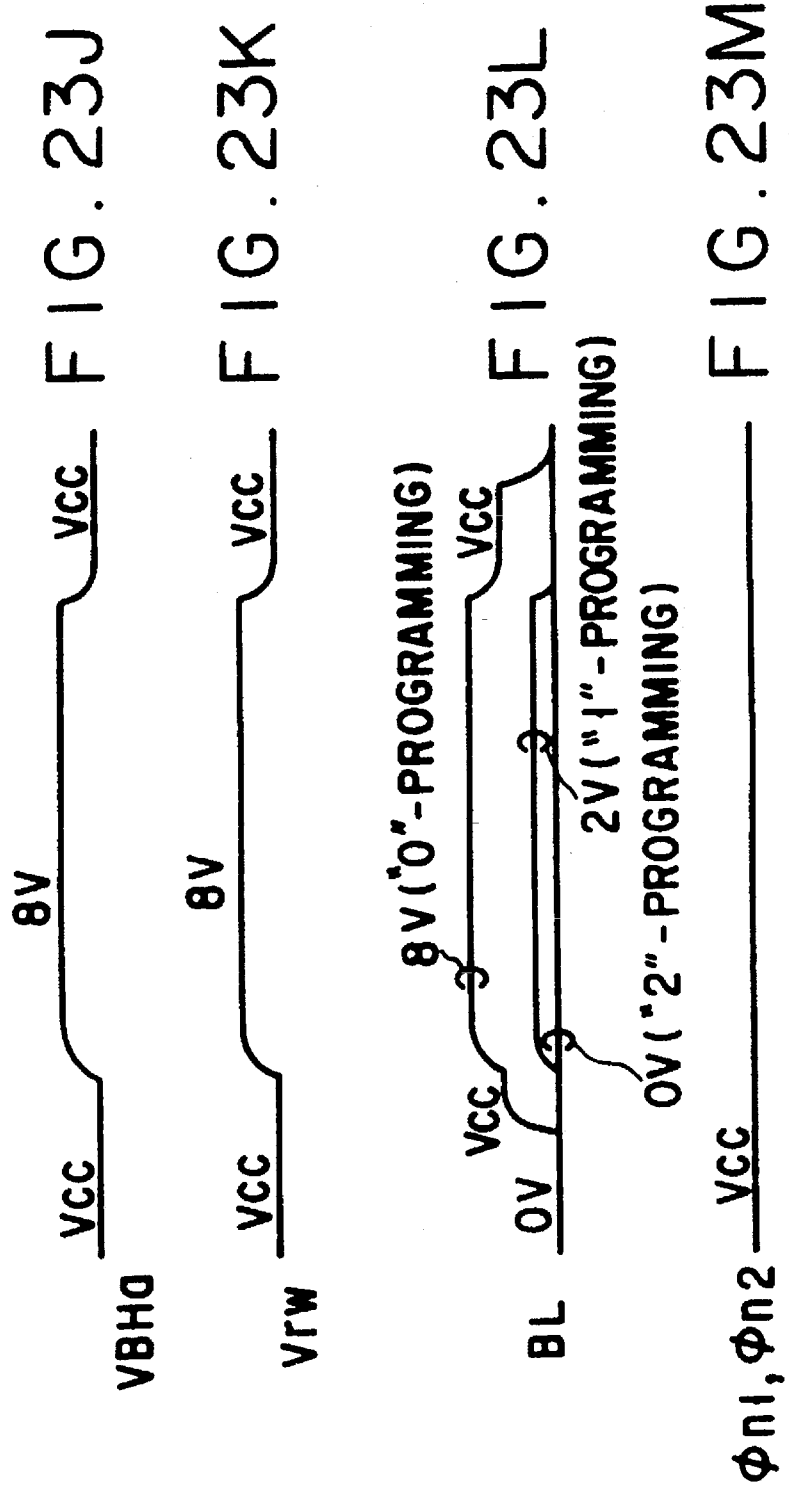

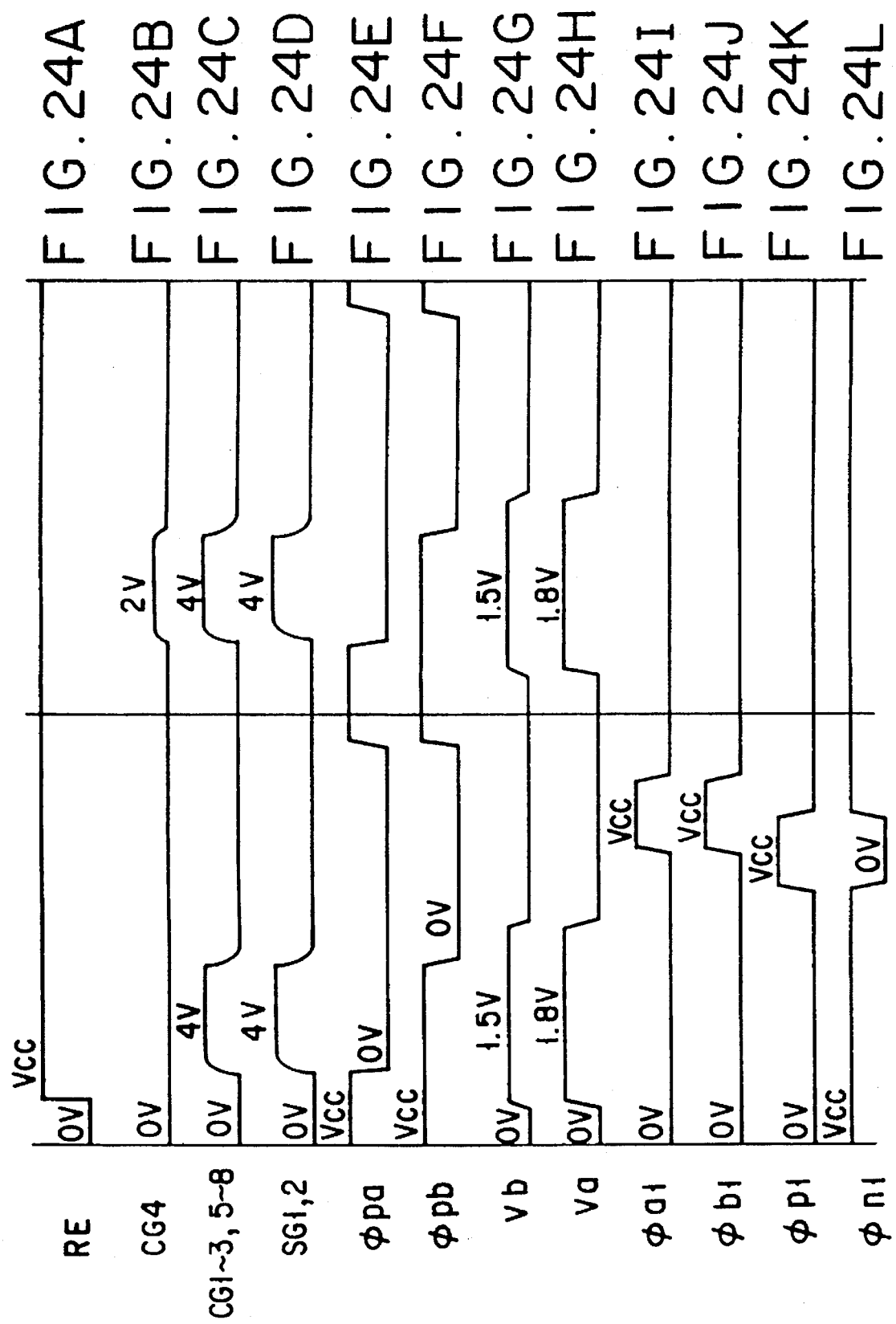

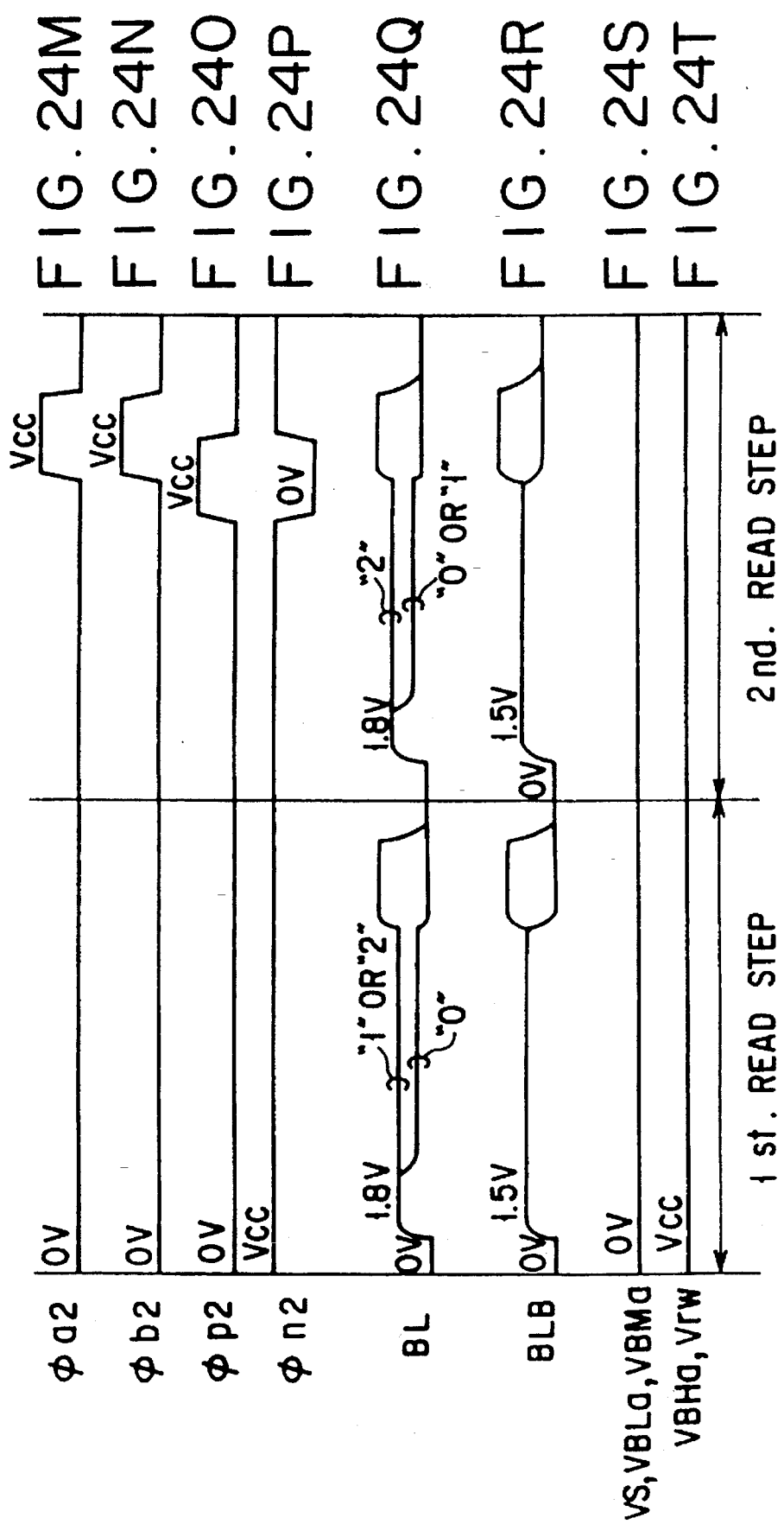

FIG. 25A RE 
FIG. 25B CSLn 
FIG. 25C $I_k, P_i$ ($k=1\sim21, i=1\sim6$) — DATA FOR READING
↓ CALCULATE SYNDROME
FIG. 25D $S_i$ ($i=1\sim6$) — SYNDROME
↓ ERROR DETECTION/CORRECTION
FIG. 25E $O_k = IOI_k = IOO_k$ ($k=1\sim21$) — OUTPUT DATA FOR READING
↓ (INTERMEDIATE BINARY CODE) DATA INVERSION
FIG. 25F $IO_\ell$ ($\ell=1\sim16$) — INFORMATION DATA FOR READING

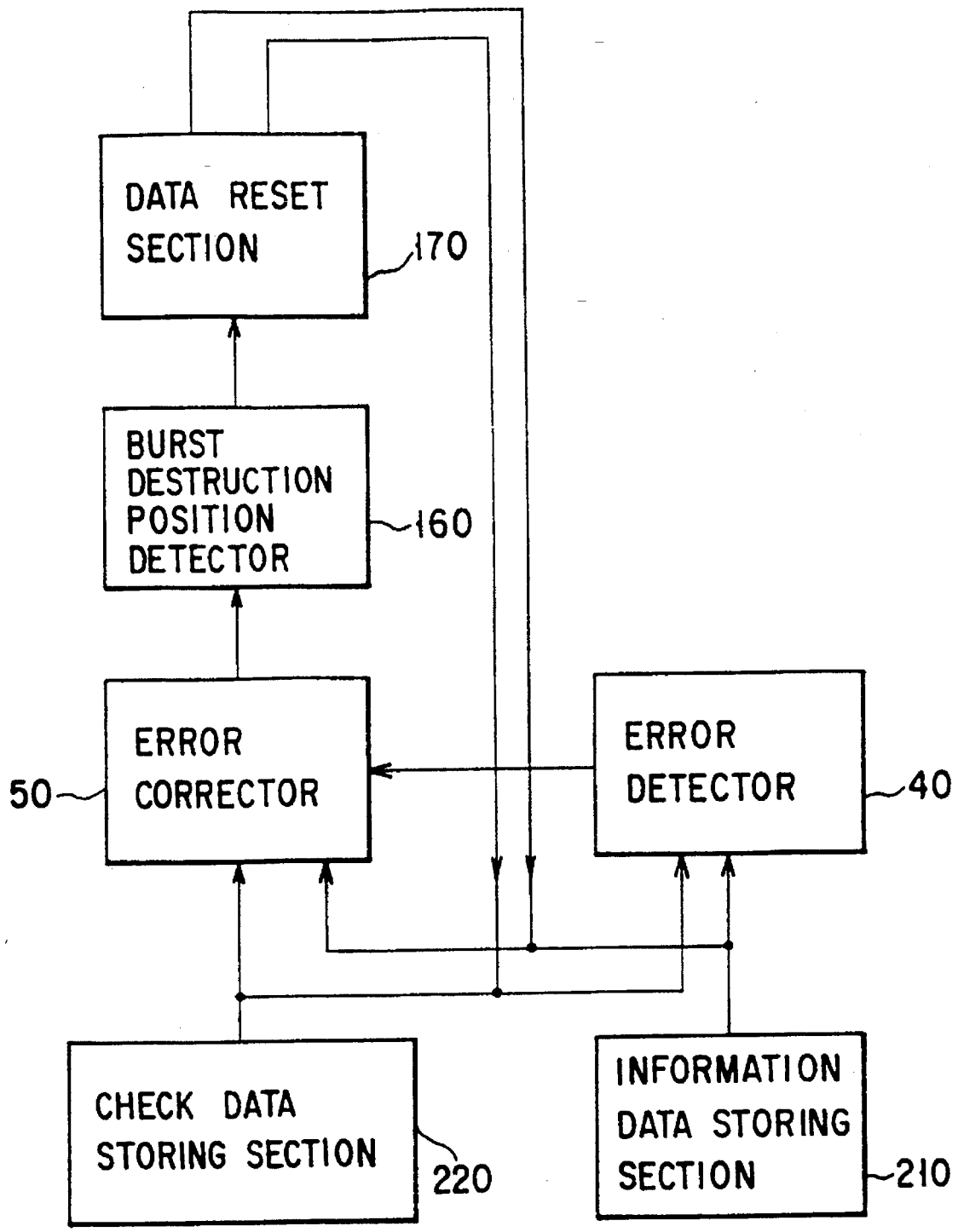
F I G. 26

MEMORY SYSTEM

BACKGROUND OF THE INVENTION

1. Field of the Invention

The present invention relates to a memory system and, more particularly, to a multi-value memory system using a nonvolatile semiconductor memory which is electrically erasable and programmable.

2. Description of the Related Art

In recent years, as a memory system, a semiconductor memory device using a semiconductor memory is popularly used. In the semiconductor memory device, degradation of reliability caused by various influences with a high degree of integration and a high integration density is posed as a problem.

For this reason, an error detection/correction code for performing error detection/correction is often applied to a semiconductor memory device. In practice, this error detection/correction code must satisfy all the following conditions.

(1) An error frequency is lower than a permissible error frequency unique to a semiconductor memory device.

(2) Coding and decoding can be performed at a high speed with a high-speed reading/writing operation.

(3) In code structure, the redundancy of the code is minimum.

For the above practical viewpoints, an SEC-DED code for correcting a 1-bit error and detecting a 2-bit error has been popularly used at present.

In order to obtain higher reliability, a DEC code for correcting a 2-bit error is applied. In particular, a byte error detection/correction code for detecting/correcting errors in units of memory packages or units of multi-bit outputting/storing elements. In order to practically use a device for processing data in units of bytes, an SbEC-DbED code for not only correcting a single-byte error but also having high capability of detecting a 2-byte error is required.

As available means for high integration, a method of multi-value storage has been considered.

In an example of multi-value dynamic semiconductor memory, a memory cell performs a multi-value storage by having three or more dispersed charge distribution stored in the memory cell. In this case, since data stored in one memory cell will be destroyed by one soft error, error correction code (e.g., byte error correction code which treats one cell data as one byte) capable of correcting the above error is required.

On the other hand, in a case of a non-volatile semiconductor multi-value memory device which is electrically erasable and programmable, a memory cell having three or more disperse threshold voltage distribution is used. For example, a multi-value ROM (read only memory) of 3-bit which is constructed by two ternary memory cells is known (Jpn. Pat. Appln KOKOKU Publication No. 5-60199), a multi-value EEPROM can construct the same as the multi-value ROM. For example, 3-bit information can be stored for two memory cells by using eight values from nine values (i.e., 3×3=9), as cell group constructed by adjacent memory cells sharing their control gates is a fundamental element. In this case, the multi-value EEPROM differs from the multi-value dynamic semiconductor memory device and has not a problem of soft error. However, charge amount stored in a charge storage layer shifts to a threshold voltage of the memory cell whose charge amount is 0, whereby data error will be raised.

The structure and operation of a ternary NAND EEPROM which can be integrated at a high density will be briefly described below. FIG. 1 is a sectional view showing a NAND cell structure. A NAND cell has a p-type substrate 11, a floating gate 14, a control gate 16, an interlaminar insulating film 17, a bit line 18, and an n-type diffusion layer 19.

A plurality of memory cells are connected in series with each other such that adjacent memory cells commonly use a source and a drain, and the adjacent memory cells are connected to a bit line as one unit, thereby constituting the NAND cell. A memory cell array is integrally formed in a p-type well formed in a p-type substrate or an n-type substrate. The drain side of the NAND cell is connected to bit lines through selection gates, and, similarly, the source and drain sides of the NAND cell are connected to a source line through selection gates. The control gates of the memory cells are continuously arranged in a row direction to constitute word lines.

The operation of the ternary NAND EEPROM is as follows.

A data writing operation is performed from a memory cell located at a position farthest from the bit line. A high voltage Vpp (=about 20 V) is applied to the control gate of a selected memory cell, an intermediate voltage Vm (=about 10 V) is applied to the control gate and selection gate of a memory cell closer to the bit line than the selected memory cell, and a voltage of 0 V, a low voltage Vdd (=about 2 V), or an intermediate voltage is applied to the bit line in accordance with data. When the voltage of 0 V or the low voltage Vdd (=about 2 V) is applied to the bit line, the potential of the bit line is transmitted to the drain of the selected memory cell, and electrons are injected from the drain into the floating gate. In this manner, the threshold voltage of the selected memory cell is positively shifted. However, a shift amount obtained when the low voltage Vdd is applied to the bit line is smaller than a shift amount obtained when the voltage of 0 V is applied to the bit line. When an intermediate voltage is applied to the bit line, no electron injection occurs, and the threshold voltage does not change.

A data erasing operation is simultaneously performed for all the memory cells in the NAND cell. More specifically, all the control gates are set to be 0 V, and the bit and source lines are set in a floating state, thereby applying a high voltage Vpp (=about 20 V) to all the selection gates, a p-type well and an n-type substrate. In this manner, the electrons in the floating gates of all the memory cells are discharged into the p-type well, and the threshold voltage is negatively shifted.

A data reading operation is performed by two cycles. In the first cycle, the control gate of a selected memory cell is set to be 0 V, and the control and selection gates of the remaining memory cells are set to be a power supply voltage Vcc (=about 5 V). In this state, it is checked whether a current flows in the selected memory cell. In the second cycle, the control gate of the selected memory cell is set to be a low voltage Vdd (=about 2 V), and the control and selection gates of the remaining memory cells are set to be the power supply voltage Vcc (=about 5 V). In this state, it is checked whether a current flows in the selected memory cell. In this case, three threshold voltages Vt satisfy Vt<0 V, 0 V=<Vt<Vdd, and Vdd=<Vt<Vcc, respectively.

When i-th data obtained upon arrangement of the magnitudes of physical amounts (e.g., the threshold voltage of a memory cell of EEPROM) for determining multi-values in a descending order is defined as multi-value data "i", a case wherein read-out multi-value data is different from written multi-value data by only one in size is considered. At this time, read-out output data may be different from written input data by 2 or more bits. As a result, at least an SbEC code is required as an error correction/detection code using input/output data as information data. In addition, in order to obtain reliability almost equal to that of an SEC-DED code used in a binary storing element, an SbEC-DbED code is required. However, this SbEC-DbED code requires a complex decoding circuit.

When a burst error such as a column failure of stored data occurs, the net capability of correcting/detecting an error decreases. When such a burst error occurs, and stored data except for the stored data at an address at which the burst error occurs has an error, at least a 2-bit error correction code must be applied to correct these errors.

For example, in a electrically erasable and programmable nonvolatile semiconductor memory (EEPROM), a unique column failure may occur. This column failure occurs when current leaks from a bit line, or data in memory cells in a common column in a block are excessively written or excessively erased. When such a column failure occurs, and a memory cell except for the memory cell at the column address at which the column failure occurs has an error, these errors cannot be corrected by a single b-bit byte error correction code such as an SbEC code. In this case, for example, a double b-bit byte error correction code is required. However, this code requires a complex decoding circuit.

As described above, the conventional memory system has the following problems.

When i-th data obtained upon arrangement of the magnitudes of physical amounts for determining multi-values in a descending order is defined as multi-value data "i", and read-out multi-value data is different from written multi-value data by only one in size, read-out output data may be different from written input data by 2 or more bits. As a result, at least an SbEC code is required as an error correction/detection code using input/output data as information data. In addition, in order to obtain reliability almost equal to that of an SEC-DED code used in a binary storing element, an SbEC-DbED code is required. However, this SbEC-DbED code requires a complex decoding circuit.

In an EEPROM, a unique column failure may occur. When such a column failure occurs, and a memory cell except for the memory cell at the column address at which the column failure occurs has an error, these errors cannot be corrected by a single b-bit byte error correction code such as an SbEC code. In this case, for example, a double b-bit byte error correction code is required. However, this code requires a complex decoding circuit.

SUMMARY OF THE INVENTION

It is an object of the present invention to provide a memory system capable of using a simple decoding circuit having relatively low redundancy and completing 2-bit error detection using an error detecting/correcting means suitably used when i-th data obtained upon arrangement of the magnitudes of physical amounts for determining multi-values in a descending order is defined as multi-value data "i", and read-out multi-value data is different from written multi-value data by only one in size.

It is another object of the present invention to provide a memory system capable of, even when a burst error occurs to generate a 2-bit error in one code word, correcting a 1-bit error and having a possibility of correcting a 2-bit error using a code for detecting the 2-bit error.

According to the present invention, in order to solve the above problems, the following means are devised.

A first memory system according to the present invention is characterized by comprising: storing means having a plurality of memory elements each of which stores one of n-value storage states corresponding to data "0", "1", ..., "n−1", the storing means including a plurality of information memory elements for storing n-value information data and a plurality of check memory elements for storing check data; converting means for respectively converting the information data and the check data stored in the memory elements into binary codes having a plurality of bits each constituted by 0 or 1, the binary codes corresponding to the information data and the check data; and detecting/correcting means for detecting and correcting an error on the basis of the binary codes corresponding to the check data and the information data. In this configuration, the converting means includes means for converting the information data and check data into binary codes including intermediate binary codes which are combinations of binary codes each of which data is stored in one of the memory elements.

Another first memory system according to the present invention is characterized by comprising: an EEPROM including a plurality of first memory cells each of which stores information data selected from at least three storage states and a plurality of second memory cells each of which stores check data selected from at least three storage states; a converter for converting the information data stored in the first memory cells and check data stored in the second memory cells into binary codes, respectively, each of the binary codes having a plurality of bits each constituted by 0 or 1; detecting/correcting means for detecting and correcting an error by using the converted binary codes of the information data and the check data. In this configuration, the binary codes including intermediate binary code and the detecting/correcting means for detecting and correcting an error by using the converted intermediate binary codes of the information data and the check data.

Where, the storing means stores the n-value information data by combinations of the plurality of memory elements.

Preferable manners of the present invention are as follows.

(1) The information data storing means includes a second converting means for causing the check memory element to generate a binary code corresponding to data to be stored in one of the memory elements, and writing means for causing the memory elements to perform n-value storage on the basis of the binary code.

(2) The converting means includes means for converting storage data of a memory element into a binary code having a plurality of bits each constituted by 0 or 1, and the detecting/correcting means includes means for detecting/correcting an error on the basis of information data and check data and outputting a data code represented by combinations of data of the plurality of memory elements on the basis of the binary code.

(3) In the configuration of (2), the first memory system is characterized by further comprising means for generating a binary code corresponding to data to be stored in the memory element of the check memory element on the basis of the binary code converted from the data code and corresponding to data to be stored in the memory element of the information memory element to cause the memory elements to perform n-value storage on the basis of the binary code.

(4) The converting means includes means for converting data such that, when a size of data in the memory element changes by one, a binary code of the data has a Hamming distance of 1, for that of the data whose size in the memory element is different by one.

(5) The memory elements perform n-value storage using charge amounts stored in the memory elements and correspond to n data "0", "1", . . . , "n–1" in an order of magnitudes of the charge amounts.

(6) The memory element is a nonvolatile memory cell obtained by stacking and forming a charge storage layer and a control gate on a semiconductor layer.

(7) A storage state of the memory element is changed by one.

(8) The storing means stores n-bit ($2^n < N^M 2^{n+1}$) information having a relation $n < 2^M$ using combinations of the M (M: an integer of not less than 2) and N-value (N: an integer of not less than 3) memory elements.

According to the first memory system of the present invention, the following effect can be obtained.

When i-th data obtained upon arrangement of the magnitudes of physical amounts for determining multi-values in a descending order is defined as multi-value data "i", and read-out multi-value data is different from written multi-value data by only one in size, a 1-bit error correction code can be applicable by introducing an intermediate binary code, 1-bit of which is shifted when multi-value data is shifted only 1 (i.e., when a Hamming distance is 1). In this manner, a decoding circuit having relatively low redundancy, i.e., a simple structure, can be used. In addition, when this application extends to an application of a 2-bit error detection code having capability of detecting a 2-bit error, 2-bit error detection can be completely performed.

For example, in an electrically erasable and programmable nonvolatile semiconductor memory (EEPROM), as shown in FIG. 2, a memory cell obtained by stacking and forming a charge storage layer 14 and a control gate 16 on a semiconductor substrate (a p-type well 11 on an n-type substrate 11') is used, and the magnitude of an amount of charge stored in the charge storage layer 14 is made discrete, i.e., a voltage Vt observed from the control gate 16 is made discrete, so that digital information can be stored. A multi-value memory is constituted by a memory cell having three or more Vt distributions.

FIG. 3 shows the correspondence between multi-values "0", "1", and "2" and the threshold voltage levels of the cells of a ternary memory. A voltage Vt obtained when the magnitude of an amount of charge stored in the charge storage layer is 0 is called a neutral voltage $Vt_0$. When this neutral voltage $Vt_0$ is set in the voltage Vt distribution of data "1", after the memory is left still for a long time, information written in the memory cell may change into information corresponding to the Vt distribution including the neutral voltage $Vt_0$. In this case, the size of an information error of is "1" at most. More specifically, an information error occurs between only data "0" and "1" and between only data "1" and "2".

FIGS. 4 and 5 are views showing the cell array portions of a NOR EEPROM and a NAND EEPROM, respectively. In a ternary memory, a basic element is constituted by a cell group constituted by, e.g., adjacent memory cells commonly using a control gate. Since one memory cell has three values, one cell group has nine values. When eight values of the nine values are used, 3-bit information can be stored per two cells.

As shown in Table 1, the correspondence relationship between ternary data and binary codes is set such that, when multi-value data are different from only one in size, a Hamming distance between the binary codes corresponding to the multi-value data is set to be one. In this manner, an error can be corrected by applying a 1-bit error correction code.

TABLE 1

| ternary data | binary code |
|---|---|
| "0" | 01 |
| "1" | 00 |
| "2" | 10 |

In addition, as in a case wherein 4-, 5-, or 8-value data is used, the correspondence relationship between multi-value data and binary codes is set as shown in Table 2, 3, or 4, and the above effect can be achieved.

TABLE 2

| 4-value data | binary code |
|---|---|
| "0" | 00 |
| "1" | 01 |
| "2" | 11 |
| "3" | 10 |

TABLE 3

| 5-value data | binary code |
|---|---|
| "0" | 000 |
| "1" | 001 |
| "2" | 011 |
| "3" | 111 |
| "4" | 110 |

TABLE 4

| 8-value data | binary code |
|---|---|
| "0" | 000 |
| "1" | 001 |
| "2" | 011 |
| "3" | 010 |
| "4" | 110 |
| "5" | 100 |
| "6" | 101 |
| "7" | 111 |

A second memory system according to the present invention is characterized by comprising: information memory element for storing information data; check data means for storing check data; error detecting/correcting means for performing error detection/correction of the information data on the basis of the information data and the check data; burst destruction position detecting means for detecting a burst destruction position of data stored in each of the storage sections; and data resetting means for supposing data at the burst destruction position detected by the burst destruction position detecting means to reset the data. The second memory system is characterized by further comprising means for performing error detection/correction using data at all possible burst destruction positions while the data resetting means and the error detecting/correcting means are repeatedly used.

According to the second memory system of the present invention, an electrically erasable and programmable nonvolatile semiconductor memory (EEPROM), even when a burst error such as a unique column failure occurs to generate a 2-bit error in one code word, corrects a 1-bit error and has a possibility of correcting a 2-bit error using a code for detecting the 2-bit error.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 7 is a schematic view showing a memory system according to the second embodiment of the present invention;

FIG. 11 is a graph showing the correspondence between intermediate binary codes and the distributions of the threshold voltages Vt of a ternary cell;

FIG. 12 is a view showing an check matrix for error correction/detection;

FIG. 22 is a chart showing timings of inputting write-in data;

FIG. 23 is a chart showing the timings of the control signal of a writing/reading circuit, cell selection gates SG1 and SG2, and control gates CG1 to CG8 in a writing operation;

FIG. 24 is a chart showing the timings of the control signal of a writing/reading circuit, cell selection gates SG1 and SG2, and control gates CG1 to CG8 in a reading operation;

FIG. 25 is a chart showing a timing of outputting read-out data;

FIG. 26 is a schematic view showing a memory system according to the seventh embodiment of the present invention;

DETAILED DESCRIPTION OF THE PREFERRED EMBODIMENTS

Embodiments of the present invention will be described below with reference to the accompanying drawings.

Figure 1:
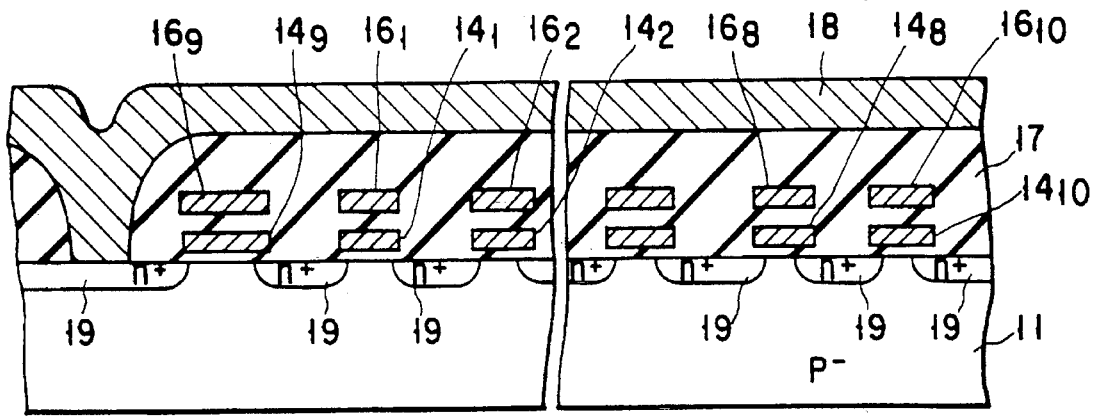
FIG. 1 a sectional view showing the structure of a NAND cell.
Figure 2:
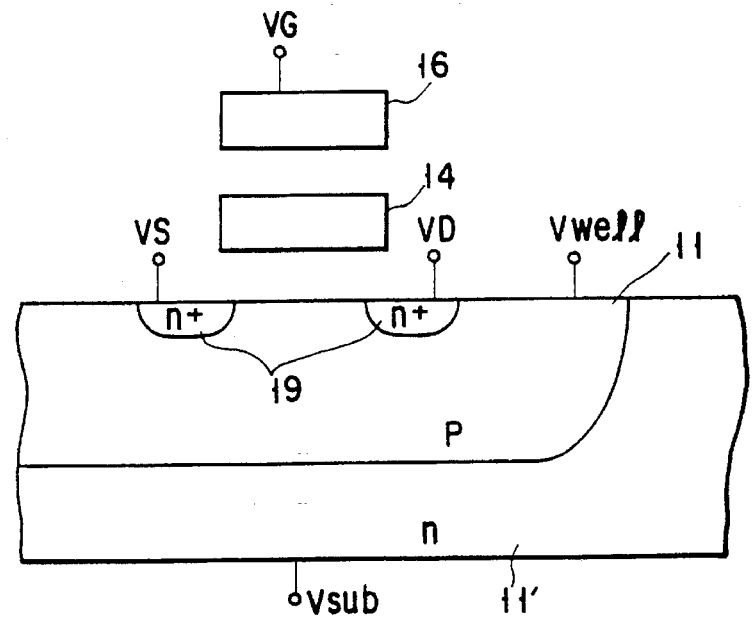
FIG. 2 is a view showing a memory cell structure of an EEPROM.
Figure 3:
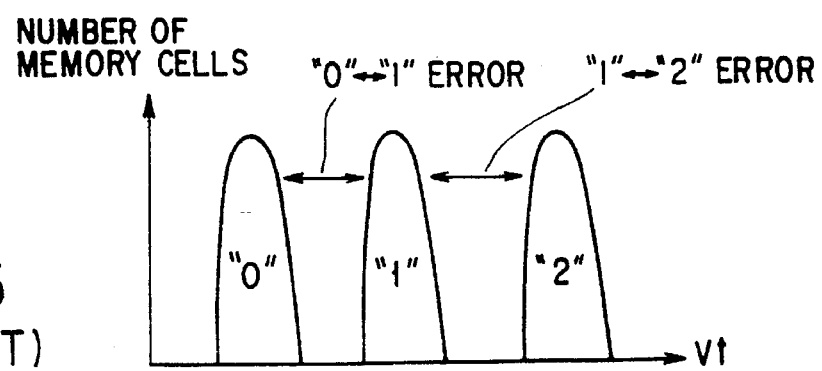
FIG. 3 is a graph showing the corresponding relationship between data "0", "1", and "2" and the threshold voltages of the memory cells of a ternary memory.
Figure 4:
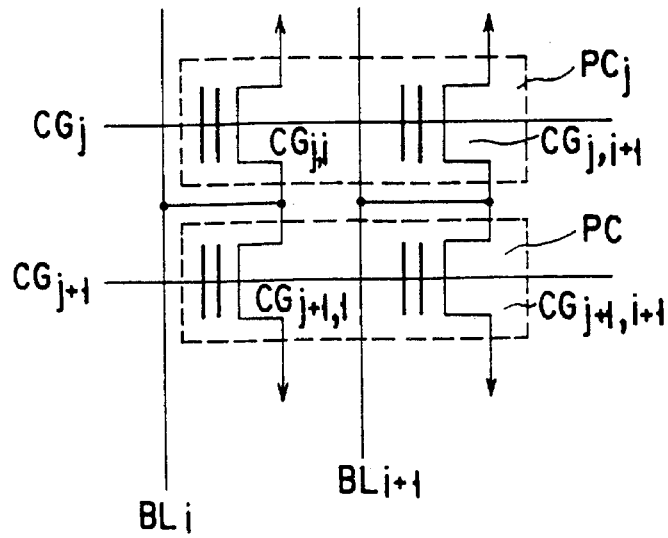
FIG. 4 is a view showing the circuit arrangement of a ternary NOR EEPROM.
Figure 5:
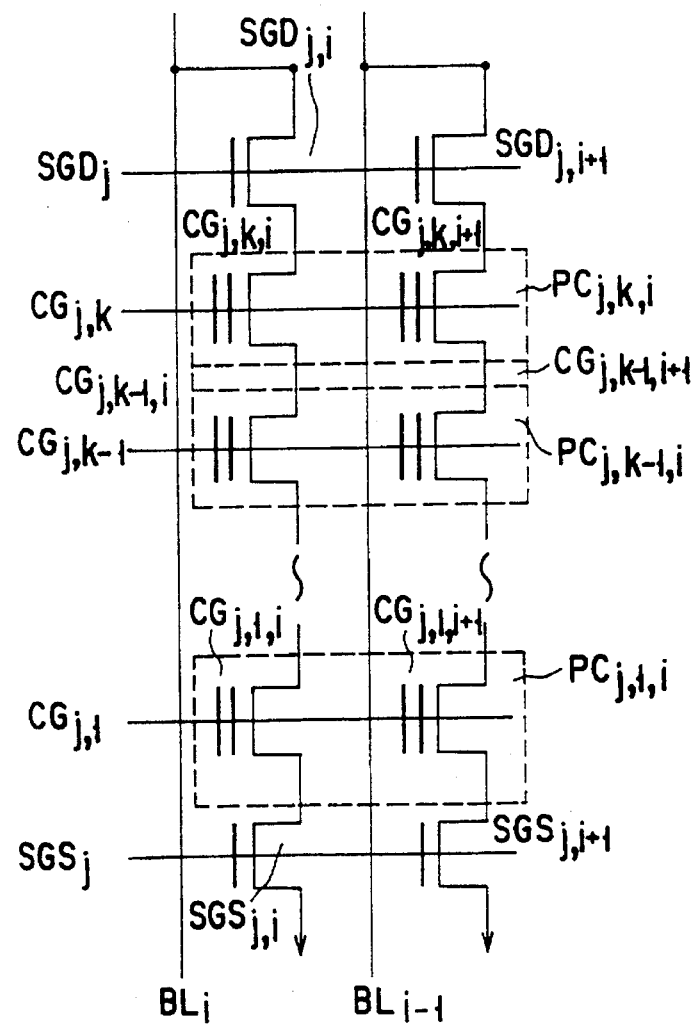
FIG. 5 is a view showing the circuit arrangement of a ternary NAND EEPROM.
Figure 6:
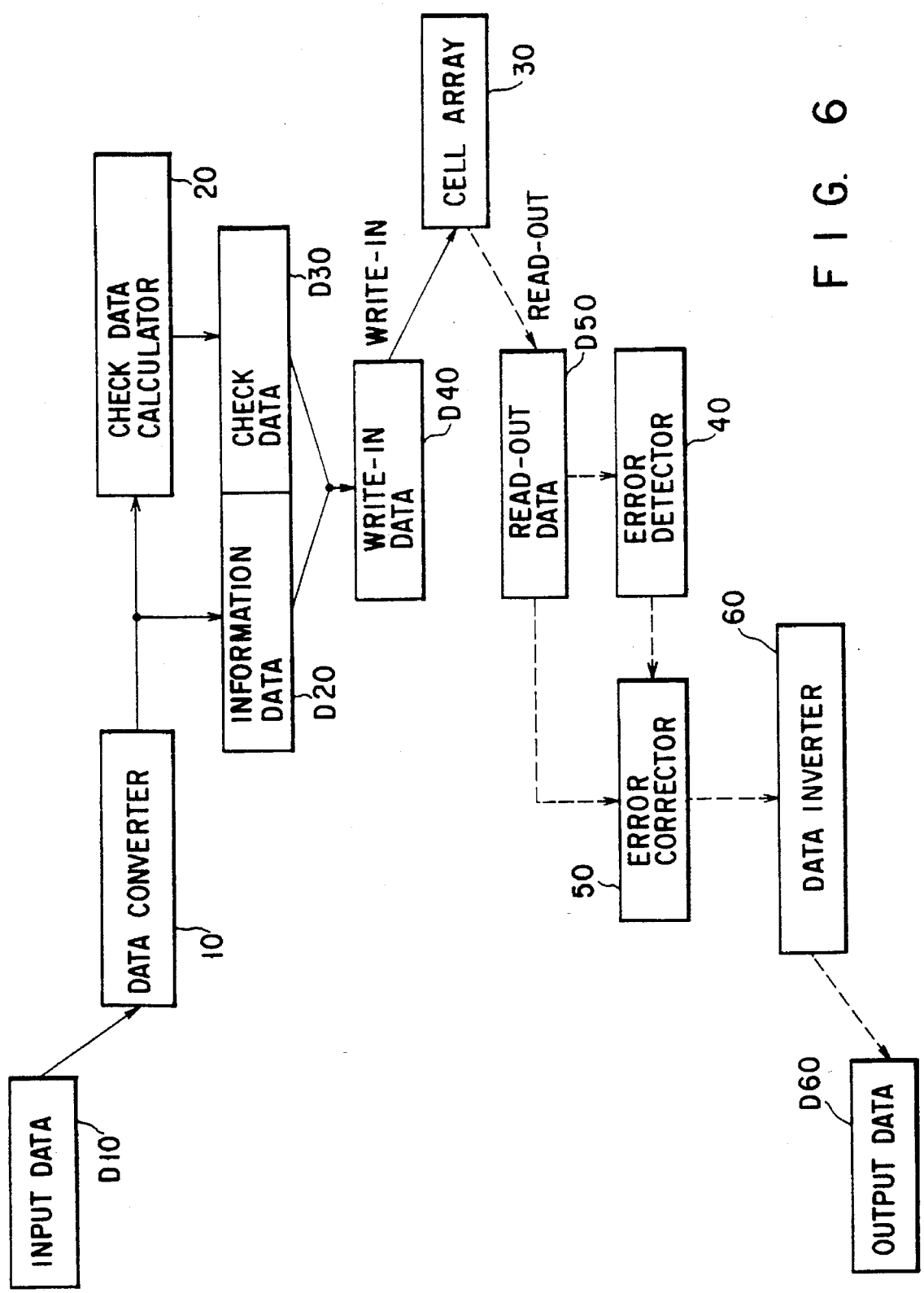
FIG. 6 is a schematic view showing a memory system according to the first embodiment of the present invention.

FIG. 6 is a schematic view showing the arrangement of a memory system according to the first embodiment of the present invention. The memory system according to the first embodiment comprises a data converter 10, an check data calculator 20, a cell array 30, an error detector 40, an error corrector 50, and a data inverter 60.

A data writing operation is performed as follows.

The data converter 10 converts input data D10 serving as write-in data into binary code having a Hamming distance of 1 when i-th data obtained upon arrangement of the magnitudes of physical amounts for determining multi-values in a descending order is defined as multi-value data "i", and read-out multi-value data is different from written multi-value data by only one in size. Thereafter, the check data calculator 20 generates check data D30 from a binary code. At this time, a binary code converted by the data converter 10 is used as information data D20, and the information data D20 and the check data D30 are written as write-in data D40 in the cell array 30.

A data reading operation is performed as follows.

Read-out data D50 read out from the cell array 30 is input to the error detector 40 and the error corrector 50. When the data read out from the cell array 30 has errors, the error detector 40 detects errors when the number of errors falls within a permissible range, and the error detector 40 outputs the positions of the detected errors to the error corrector 50. When the number of errors detected by the error detector 40 falls within an permissible range, the error corrector 50 corrects the errors of the read-out data D50 read out from the cell array 30. At this time, the error corrector 50 outputs the multi-value information data of a binary code. The data inverter 60 inverts the information data into output data D60 serving as read-out data from the cell array 30 and outputs the output data D60.

As described above according to the first embodiment, assume that i-th data obtained upon arrangement of the magnitudes of physical amounts for determining multi-values in a descending order is defined as multi-value data "i", and read-out multi-value data is different from written multi-value data by only one in size. In this case, data are converted into binary code having a Hamming distance of 1 when multi-value information data is converted into a binary code, and the multi-value data is different from the binary code are different from each other by one in size. For this reason, a 1-bit error correction code can be applied to the memory system according to the first embodiment. Therefore, a decoding circuit having a relatively low redundancy, and a simple decoding circuit can be used. In addition, when the application of the 1-bit error detection code extends to the application of a 2-bit error detection code having a 2-bit error detection capability, 2-bit error detection can be completely performed.

FIG. 7 is a schematic view showing the arrangement of a memory system according to the second embodiment of the present invention. Referring to FIG. 7, the same reference numerals as in FIG. 6 denote the same parts in FIG. 7, and a description thereof will be omitted. The second embodiment describes that each constituent element in the first embodiment is included in either of a CPU 100 or an EEPROM 200.

According to the second embodiment, the CPU 100 has a data converter 10, an check data calculator 20, an error corrector 50, an error detector 40, and a data inverter 60, and the EEPROM 200 has only a cell array 30. In the second embodiment, data which is exchanged between the CPU 100 and the EEPROM 200 is a binary code.

Figure 8:
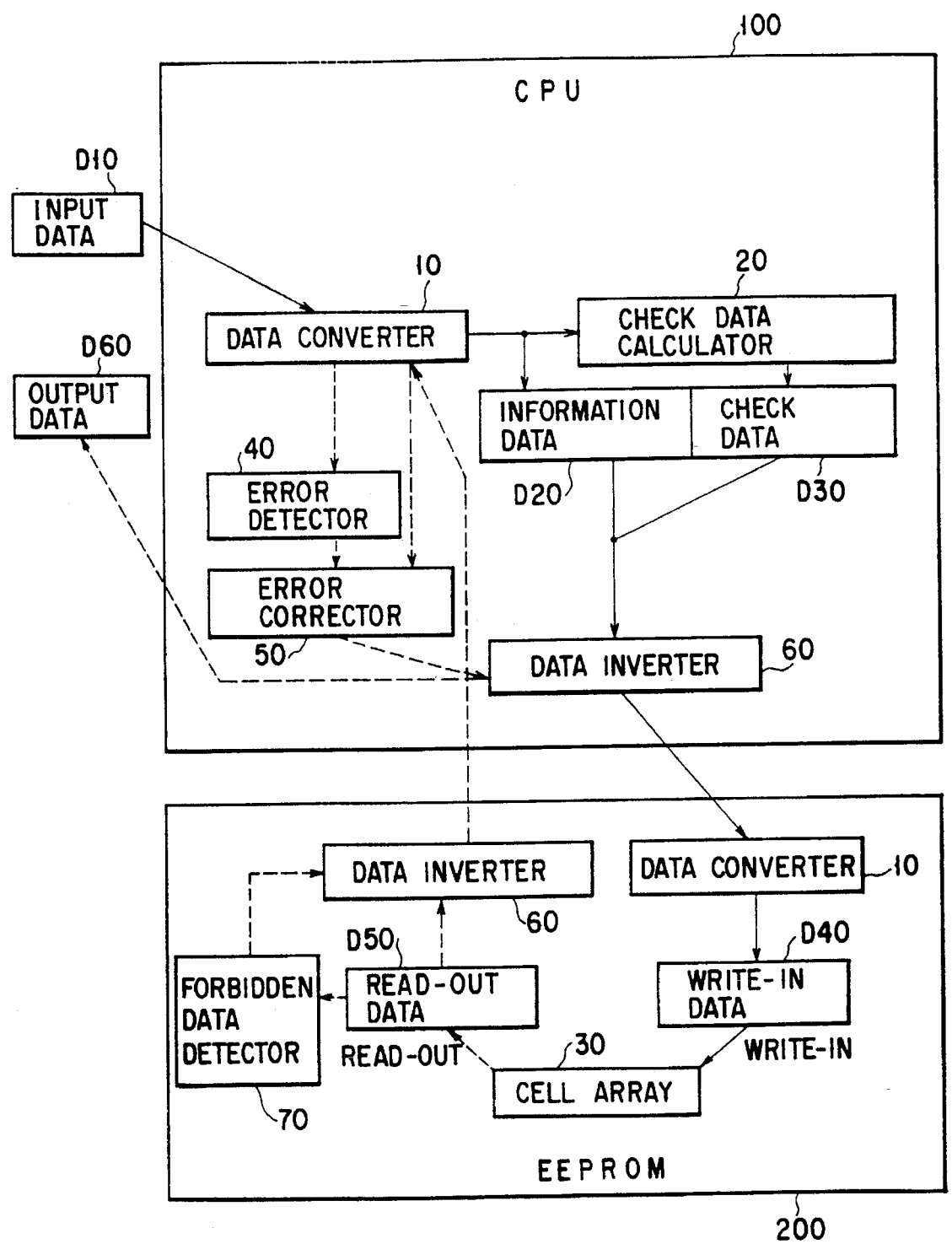
FIG. 8 is a schematic view showing a memory system according to the third embodiment of the present invention.

FIG. 8 is a schematic view showing the arrangement of a memory system according to the third embodiment of the present invention. The same reference numerals as in FIG. 6 denote the same parts in FIG. 8, and a description thereof will be omitted.

According to the third embodiment, unlike the second embodiment, an EEPROM 200 has a data converter 10 and a data inverter 60 as in a CPU 100. In this case, data which is exchanged between the CPU 100 and the EEPROM 200 is not a binary code but normal information data. However, according to the third embodiment, a forbidden data detector 70 is arranged in the EEPROM 200 such that, when read-out data D50 has errors and is converted into an unused binary code, the error is detected and output outside the EEPROM 200 (e.g., such that the output buffer of the EEPROM 200 is set in a high-impedance state).

Figure 9:
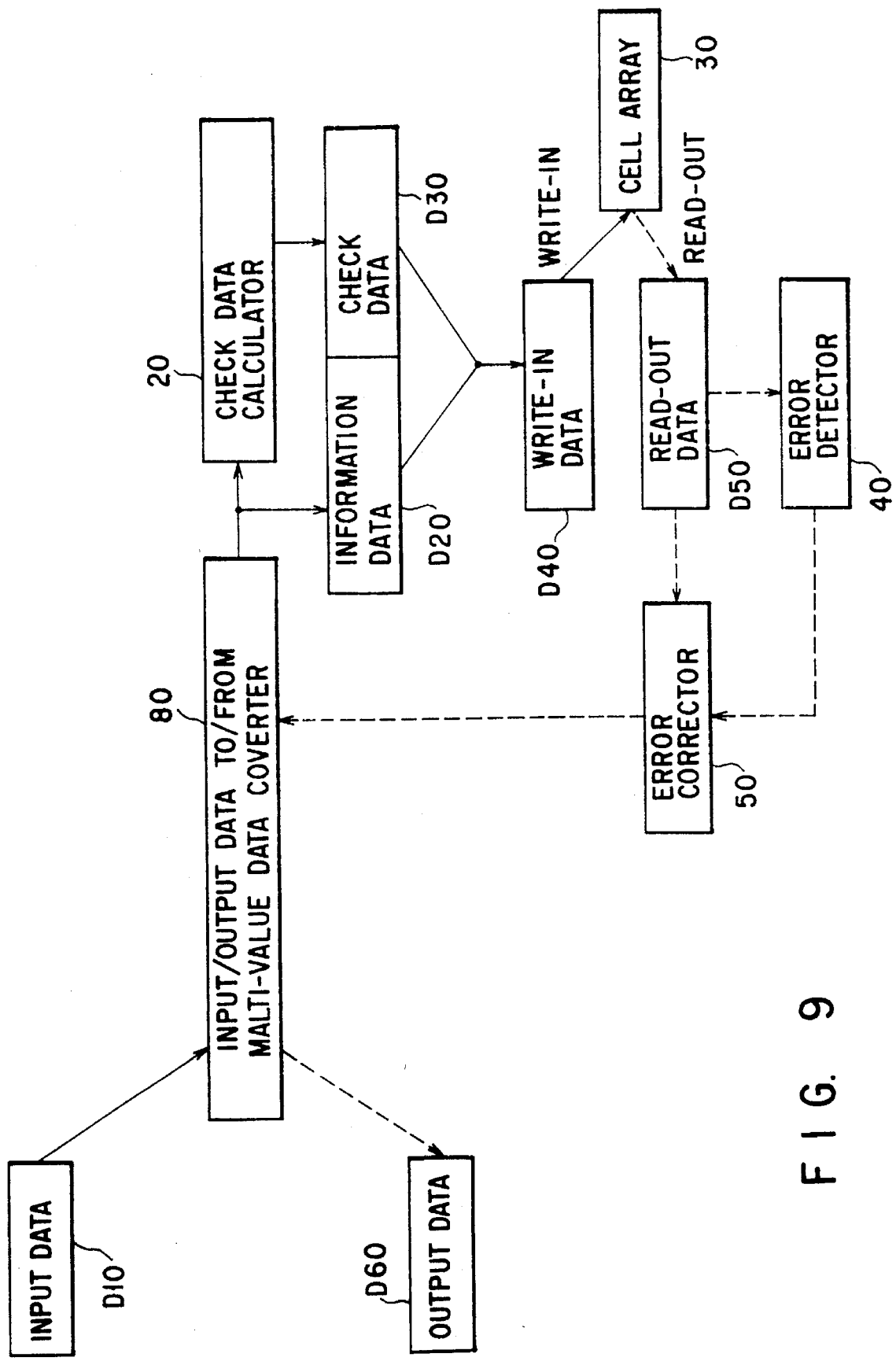
FIG. 9 is a schematic view showing a memory system according to the fourth embodiment of the present invention.

FIG. 9 is a schematic view showing the arrangement of a memory system according to the fourth embodiment of the present invention. The same reference numerals as in FIG. 6 denote the same parts in FIG. 9, and a description thereof will be omitted.

The fourth embodiment is obtained such that the data converter 10 and the data inverter 60 in the first embodiment of the present invention are integrated with each other. The fourth embodiment has the same basic operation as that of the first embodiment of the present invention. However, only data having a $2^n$ value (n: an integer which is 2 or more) is used in the fourth embodiment.

A writing operation is performed as follows.

When it is assumed that i-th data obtained upon arrangement of the magnitudes of physical amounts for determining multi-values in a descending order is defined as multi-value data "i", and read-out multi-value data is different from written multi-value data by only one in size, an input/output data to/from multi-value data converter 80 converts input data D10 serving as write-in data into binary code having a Hamming distance of 1 when the multi-value data is converted into a binary code, and the multi-value data is different from the binary code by only one in size. Thereafter, an check data calculator 20 generates check data D30 from the binary code. At this time, the binary code converted by the data converter 10 is used as information data D20, and the information data D20 and the check data D30 are written as error detector 40 in a cell array 30.

A data reading operation is performed as follows.

Read-out data D50 read out from the cell array 30 is input to the error detector 40 and the error corrector 50. When the data read out from the cell array 30 has errors, the error detector 40 detects errors when the number of errors falls within a permissible range, and the error detector 40 outputs the bit position information of the detected errors to the error corrector 50. When the number of errors detected by the error detector 40 falls within a permissible range, the error corrector 50 corrects the errors of the read-out data D50 read out from the cell array 30. The error corrector 50 outputs the multi-value information data of a binary code. The input/output data to/from multi-value data converter 80 inverts the information data into output data D60 serving as read-out data and outputs the output data D60.

Figure 10:
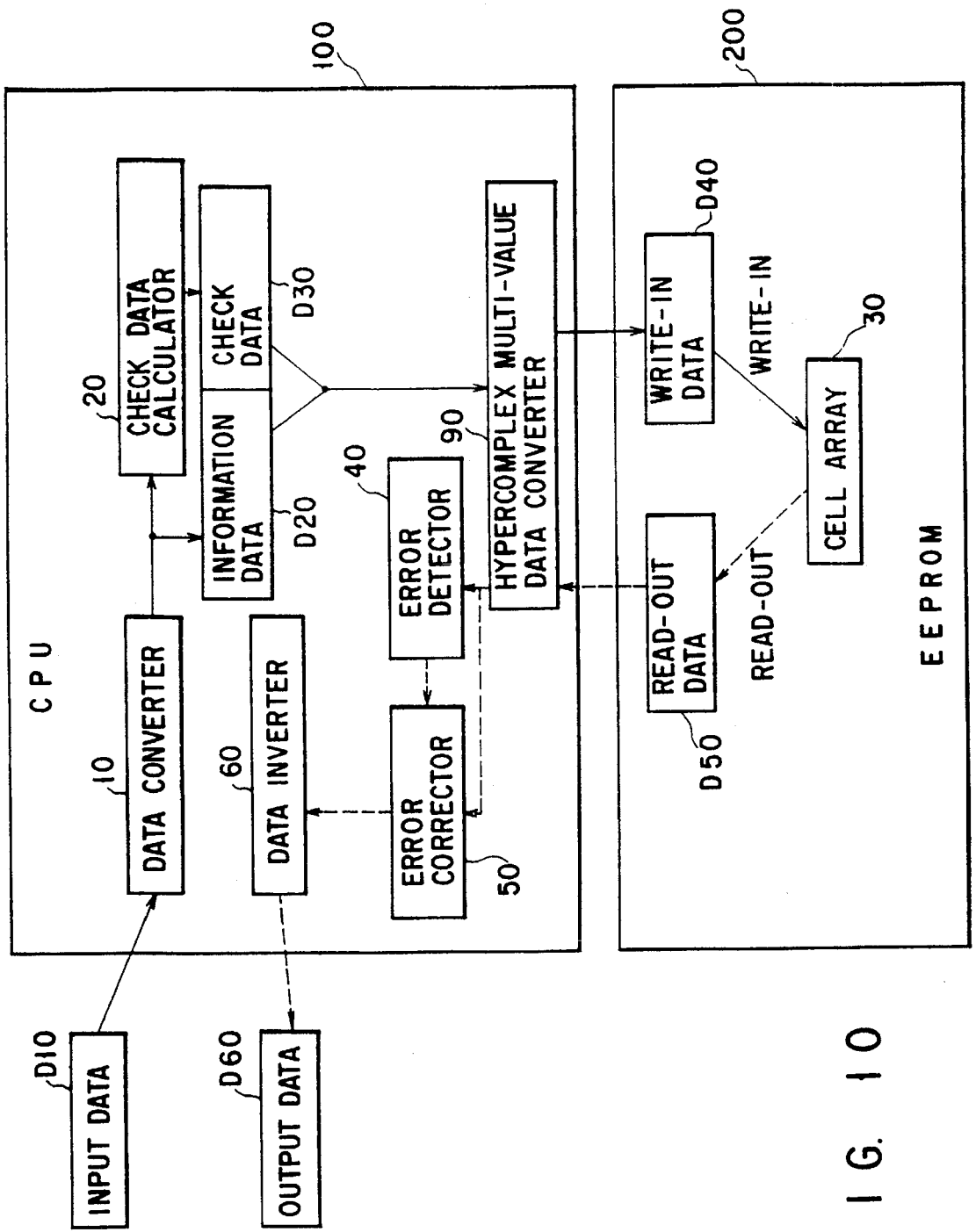
FIG. 10 is a schematic view showing a memory system according to the fifth embodiment of the present invention.

FIG. 10 is a schematic view showing the arrangement of a memory system according to the fifth embodiment of the present invention. The same reference numerals as in FIG. 6 denote the same parts in FIG. 10, and a description thereof will be omitted.

The fifth embodiment describes an arrangement in which hypercomplex multi-value data is used as data which is exchanged between the CPU 100 and the EEPROM 200 in the second embodiment of the present invention. The fifth embodiment has the same basic operation as that of the second embodiment of the present invention.

In a writing operation, a data converter 10 converts input data D10 serving as write-in data into binary code having a Hamming distance of 1 when i-th data obtained upon arrangement of the magnitudes of physical amounts for determining multi-values in a descending order is defined as multi-value data "i", and read-out multi-value data is different from written multi-value data by only one in size. Thereafter, the check data calculator 20 generates check data D30 from the binary code. The binary code is used as information data D20, and these data are input to a hypercomplex multi-value data converter 90. The hypercomplex multi-value data converter 90 converts the input data into hypercomplex multi-value data and outputs it.

With the above arrangement, data which is exchanged between the CPU 100 and the EEPROM 200 becomes hypercomplex multi-value data. The hypercomplex multi-value data input to the EEPROM 200 is written in a cell array 30 as write-in data D40.

In a reading operation, hypercomplex multi-value read-out data D50 read out from the cell array 30 is input to the hypercomplex multi-value data converter 90 of the CPU 100. The hypercomplex multi-value data converter 90 converts the input hypercomplex multi-value data into a binary code. Thereafter, the data is input to an error detector 40 and an error corrector 50. When the data read out from the cell array 30 has errors, the error detector 40 detects errors when the number of errors falls within a permissible range, and the error detector 40 outputs the position information of the detected errors to the error corrector 50. When the number of errors detected by the error detector 40 falls within a permissible range, the error corrector 50 corrects the errors of the read-out data D50 read out from the cell array 30. The error corrector 50 outputs the multi-value information data of a binary code. The data inverter 60 inverts the information data into output data D60 serving as read-out data and outputs the output data D60.

The sixth embodiment of the present invention describes error correction/detection of a multi-value memory system using a multi-value memory which obtains three bits by using eight combinations of the nine combinations of the states of two ternary memory cells. In each of the above embodiments, after memory information is converted into binary codes (including an intermediate binary code), error correction is performed. However, the sixth embodiment describes a practical case wherein error correction is performed using an intermediate binary code as a binary code in each of the above embodiments. The sixth embodiment will be described below.

FIG. 11 shows a case wherein the distributions ("0", "1", and "2") of threshold voltages Vt of a ternary cell respectively correspond to intermediate binary codes 00, 01, and 11. Referring to FIG. 11, the threshold voltages in each distribution respectively satisfy Vt=<-1 V, 0 V=<Vt=<1 V, 2 V=<Vt=<3 V. Assume that eight combinations of the intermediate binary codes of a cell 1 and a cell 2 which are two memory cells to be combined with each other are called intermediate binary codes, respectively. In this case, the relationships between combination and 8-bit intermediate binary codes corresponding to the combination are shown in Table 5. As is apparent from Table 5, when a state can be changed by "1", input/output data "1""1" may change to four cases, "0""1", "2""1", "1""0" and "1""2", but 3-bit information changed by one bit is only three. As a result, a 2-bit error correction code is necessary for 3-bit information, while a 1-bit error correction code is sufficient for intermediate binary code.

TABLE 5

| combination of the states for the two memory cells | 3-bit information | intermediate binary code |
|---|---|---|
| "0""0" | 000 | 0000 |
| "0""1" | 001 | 0001 |
| "0""2" | 011 | 0011 |
| "1""0" | 100 | 0100 |
| "1""1" | 101 | 0101 |
| "1""2" | 111 | 0111 |
| "2""0" | 010 | 1100 |
| "2""1" | 110 | 1101 |

FIG. 12 shows an check matrix, for error correction/detection in which a 1-bit error of a 21-bit intermediate binary code is corrected, and a 2-bit error in 27 bits obtained by adding 6 check bits to the 21 bits of the intermediate binary code.

Figures 13A, 13B:
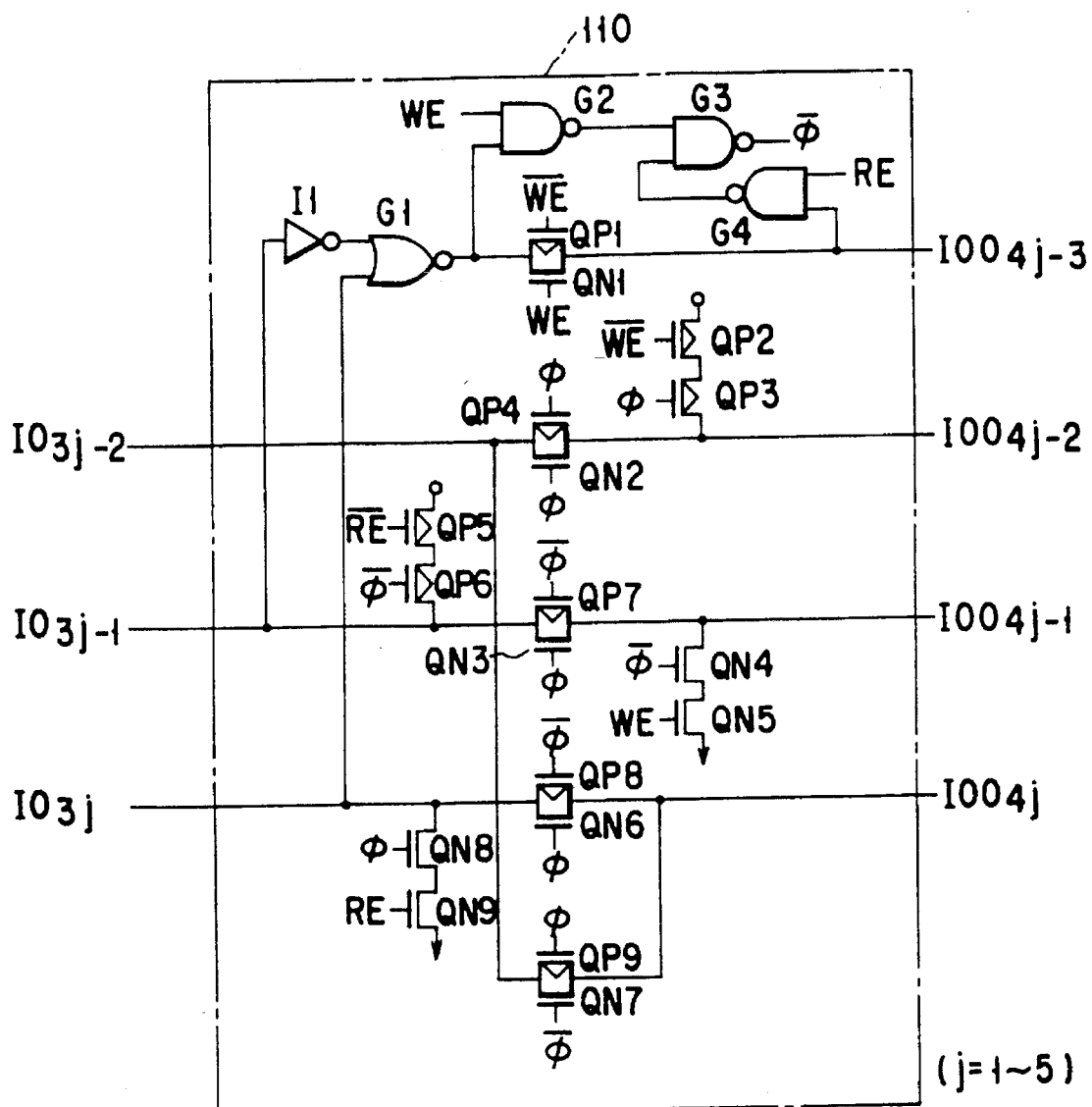
FIGS. 13A and 13B are circuit diagrams of a data converting circuit.

FIGS. 13A and 13B are circuit diagrams of a data converting circuit 110 for performing conversion from information data into an intermediate binary code and inversion therebetween. A signal WE goes to high level in a writing operation, and a signal RE goes to high level in a reading operation. Referring to FIG. 13A, a signal with a bar (e.g., /WE) indicates a signal obtained by inverting the corresponding signal. The data converting circuit 110 converts information data into an intermediate binary code in a writing operation, and information data is inverted into information data in a reading operation. As shown in FIG. 13A, of information data $IO_1$ (1=1 to 15) of 16 bits, 15-bit data are converted into 4-bit intermediate binary codes $IOO_k$ (k=1 to 20) every three bit. The remaining information data $IO_{16}$ is converted into an intermediate binary code $IOO_{21}$, as shown in FIG. 13B. The 16-bit information is not directly processed, but 21-bit data of the intermediate binary codes IOO converted by the data converting circuit 110 is processed as information data of an error correction code.

Figure 14A:
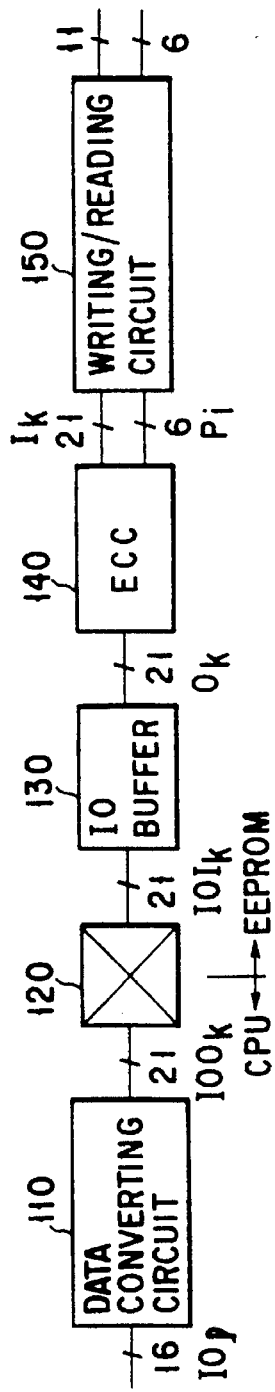
FIGS. 14A to 14C are views showing the connecting relationships between a data converting circuit, an IO pad, an IO buffer, an error correcting/detecting circuit (ECC), and a writing/reading circuit.
Figure 14B:
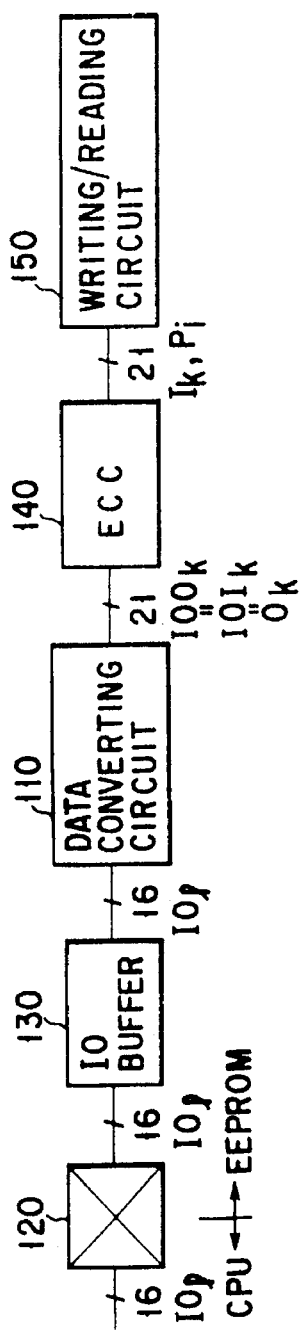
Figure 14C:
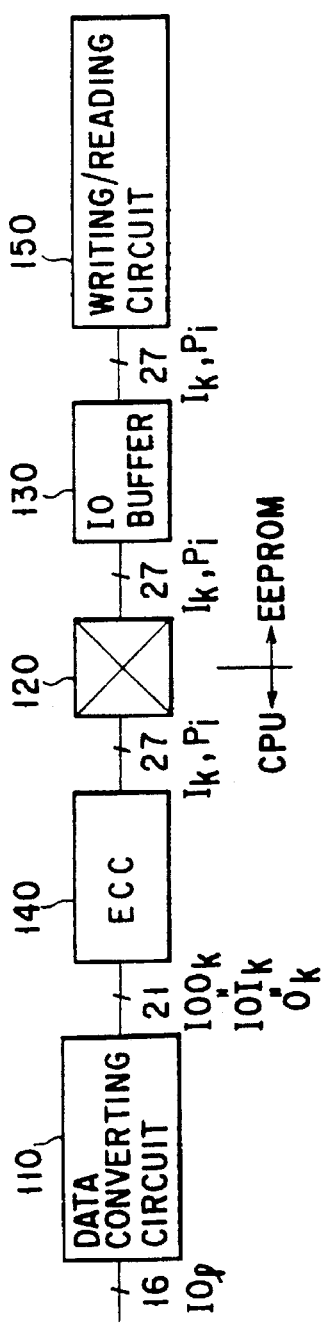
Figures 15A, 15B:
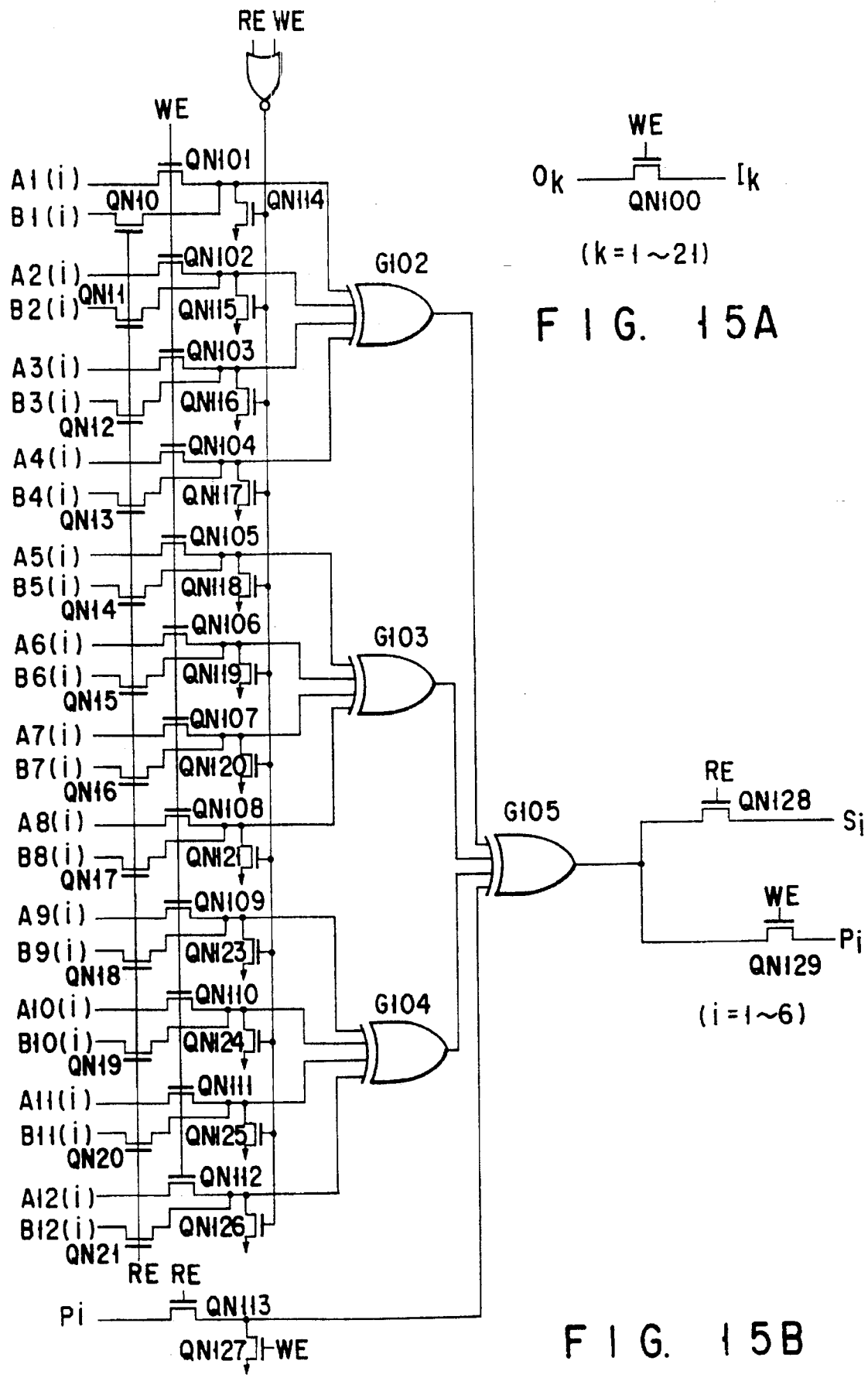
FIGS. 15A and 15B are views showing arrangements the ECC.

FIGS. 14A to 14C show the connecting relationship between the data converting circuit 110, an IO pad 120 serving as the data input/output pins of an EEPROM 200, an IO buffer 130, an error correcting/detecting circuit (ECC) 140, and a writing/reading circuit 150.

Referring to FIG. 14A, the data converting circuit 110 is arranged on the CPU 100 side, and the EEPROM 200 receives intermediate binary codes of 21 bits. Referring to FIG. 14B, the EEPROM 200 has the data converting circuit 110, the ECC 140, and a writing/reading circuit 150, and the EEPROM 200 receives and outputs 16-bit information data. Referring to FIG. 14C, the CPU 100 has the data converting circuit 110 and the ECC 140, and the EEPROM 200 receives and outputs the intermediate binary codes of 21 bits and 6 check bits.

FIGS. 15A to 17 show arrangements of the ECC 140 which corrects a 1-bit error of 21-bit intermediate binary code and detects a 2-bit error in 27 bits obtained by adding the 6 check bits to the 21 bits of the intermediate binary code. Error detection/correction performed by the ECC 140 is realized using the detection matrix shown in FIG. 12. In a writing operation, write-in information data $I_k$ (k=1 to 21) is set to be an input $O_k$ by the circuit shown in FIG. 15A. The circuit shown in FIG. 15B is a circuit which generates check data in a write-in operation and generates a syndrome in a reading operation. This circuit has 6 combinations, and input A(i) and an input B(i) are given in Tables 6 and 7.

TABLE 6

|  | i = 1 | i = 2 | i = 3 | i = 4 | i = 5 | i = 6 |
|---|---|---|---|---|---|---|
| A1(i) | $I_1$ | $I_1$ | $I_1$ | $I_2$ | $I_3$ | $I_4$ |
| A2(i) | $I_5$ | $I_2$ | $I_2$ | $I_3$ | $I_4$ | $I_5$ |
| A3(i) | $I_6$ | $I_6$ | $I_3$ | $I_4$ | $I_5$ | $I_6$ |
| A4(i) | $I_7$ | $I_8$ | $I_9$ | $I_7$ | $I_7$ | $I_8$ |
| A5(i) | $I_9$ | $I_{10}$ | $I_{11}$ | $I_{10}$ | $I_8$ | $I_9$ |
| A6(i) | $I_{10}$ | $I_{11}$ | $I_{12}$ | $I_{12}$ | $I_{11}$ | $I_{12}$ |
| A7(i) | $I_{13}$ | $I_{14}$ | $I_{13}$ | $I_{13}$ | $I_{14}$ | $I_{15}$ |
| A8(i) | $I_{16}$ | $I_{17}$ | $I_{15}$ | $I_{14}$ | $I_{15}$ | $I_{16}$ |
| A9(i) | $I_{17}$ | $I_{18}$ | $I_{18}$ | $I_{16}$ | $I_{17}$ | $I_{18}$ |
| A10(i) | $I_{19}$ | $I_{19}$ | $I_{19}$ | $I_{19}$ | $I_{19}$ | $I_{20}$ |
| A11(i) | $I_{20}$ | $I_{20}$ | $I_{20}$ | $I_{20}$ | $I_{21}$ | $I_{21}$ |
| A12(i) | $I_{21}$ | $I_{21}$ | $I_{21}$ | 0 | 0 | 0 |

TABLE 7

|  | i = 1 | i = 2 | i = 3 | i = 4 | i = 5 | i = 6 |
|---|---|---|---|---|---|---|
| B1(i) | $O_1$ | $O_1$ | $O_1$ | $O_2$ | $O_3$ | $O_4$ |
| B2(i) | $O_5$ | $O_2$ | $O_2$ | $O_3$ | $O_4$ | $O_5$ |
| B3(i) | $O_6$ | $O_6$ | $O_3$ | $O_4$ | $O_5$ | $O_6$ |
| B4(i) | $O_7$ | $O_8$ | $O_9$ | $O_7$ | $O_7$ | $O_8$ |
| B5(i) | $O_9$ | $O_{10}$ | $O_{11}$ | $O_{10}$ | $O_8$ | $O_9$ |
| B6(i) | $O_{10}$ | $O_{11}$ | $O_{12}$ | $O_{12}$ | $O_{11}$ | $O_{12}$ |
| B7(i) | $O_{13}$ | $O_{14}$ | $O_{13}$ | $O_{13}$ | $O_{14}$ | $O_{15}$ |
| B8(i) | $O_{16}$ | $O_{17}$ | $O_{15}$ | $O_{14}$ | $O_{15}$ | $O_{16}$ |
| B9(i) | $O_{17}$ | $O_{18}$ | $O_{18}$ | $O_{16}$ | $O_{17}$ | $O_{18}$ |
| B10(i) | $O_{19}$ | $O_{19}$ | $O_{19}$ | $O_{19}$ | $O_{19}$ | $O_{20}$ |
| B11(i) | $O_{20}$ | $O_{20}$ | $O_{20}$ | $O_{20}$ | $O_{21}$ | $O_{21}$ |
| B12(i) | $O_{21}$ | $O_{21}$ | $O_{21}$ | 0 | 0 | 0 |

Figure 16:
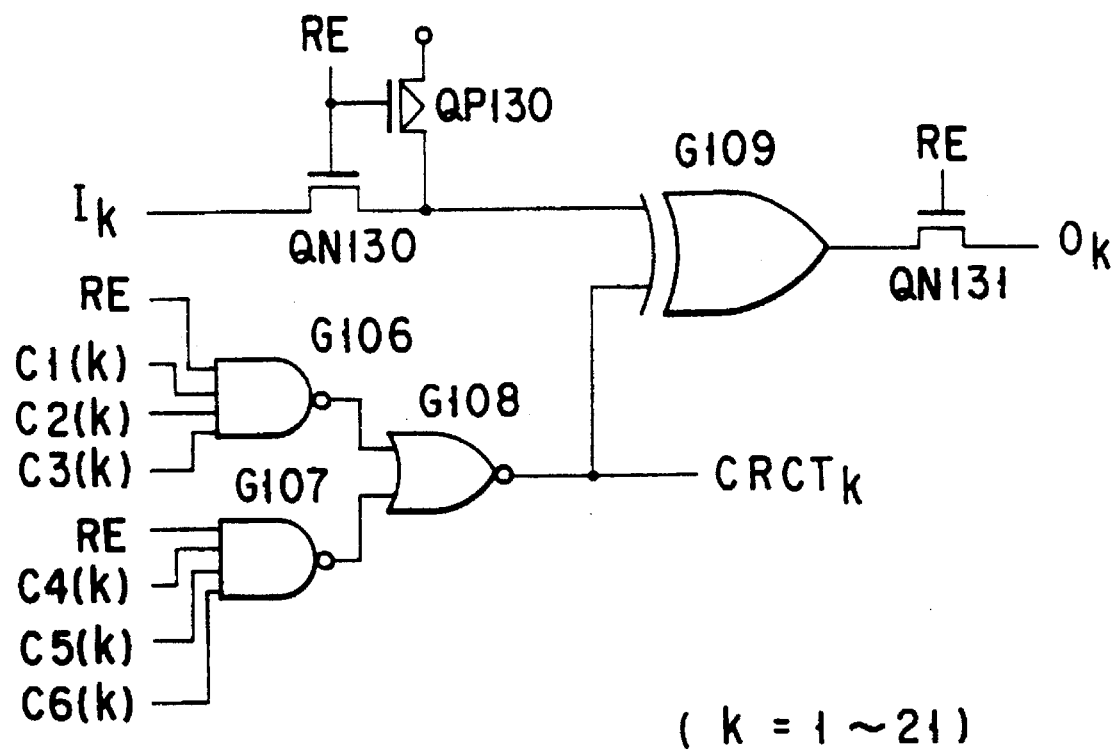
FIG. 16 is a view showing the arrangement of the error correcting circuit.
Figure 17:
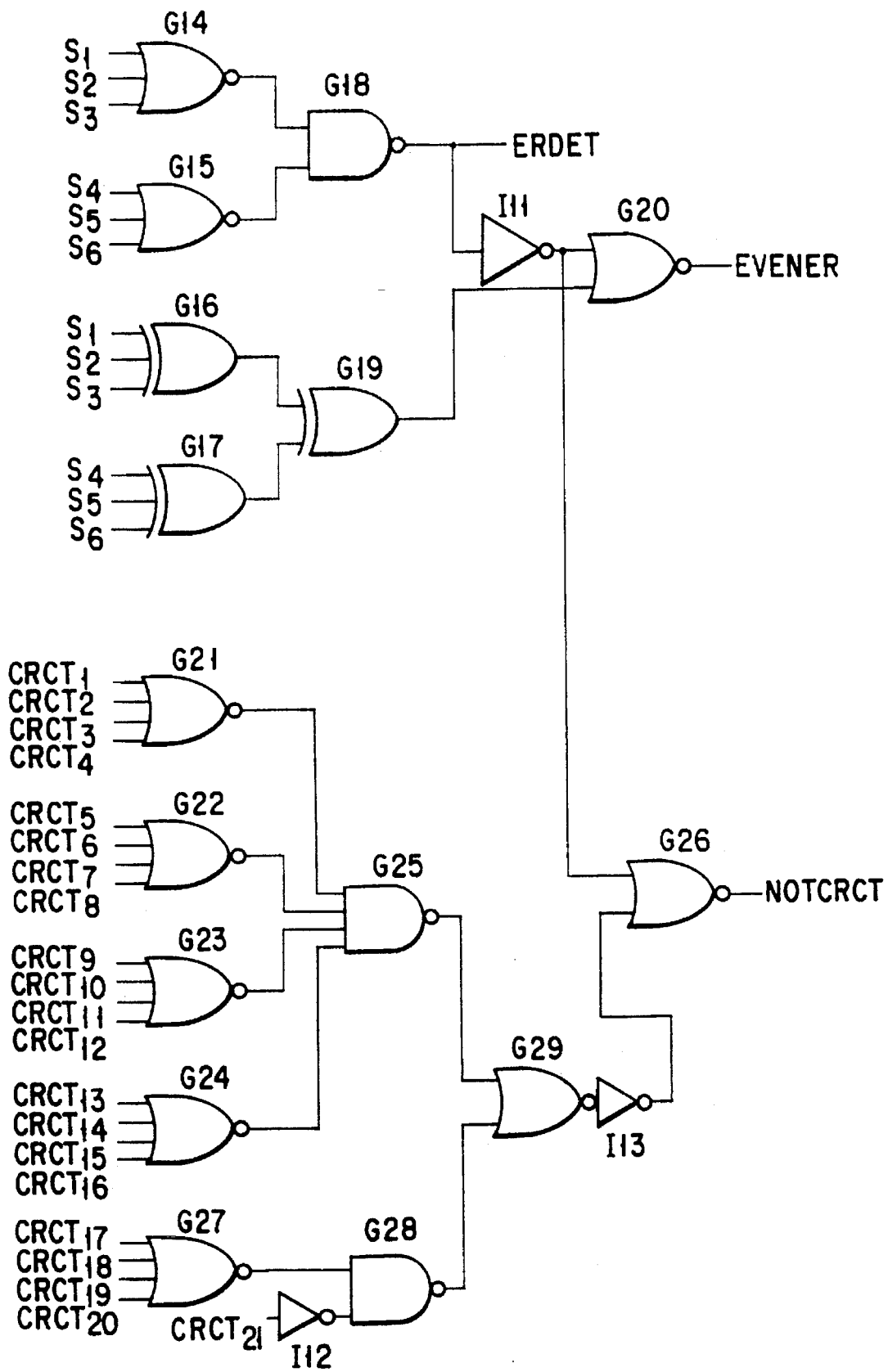
FIG. 17 is a view showing an error informing circuit.

FIG. 16 is a view showing an arrangement of an error correcting/detecting circuit. In the error correcting circuit shown in FIG. 16, in a reading operation, the syndrome inverts read-out information data $I_k$ when a signal $CRCT_k$ for informing that an error has occurred goes to high level in the pattern of FIG. 12 to perform error correction, thereby outputting an output $O_k$. Otherwise, this error correcting circuit directly outputs the read-out information data $I_k$ as the output $O_k$.

The circuit in FIG. 17A is a circuit in which, when at least one of syndromes $S_i$ (i=1 to 6) goes to "1" (high), a signal ERDET is set to be "1" to inform that an error occurs. At this time, when the number of syndromes which go to "1" is an even number, the signal EVENER goes to "1", thereby informing that an even number of errors has occurred. Although errors occur, when the errors are not corrected, a signal NOTCRCT goes to "1".

Figure 18:
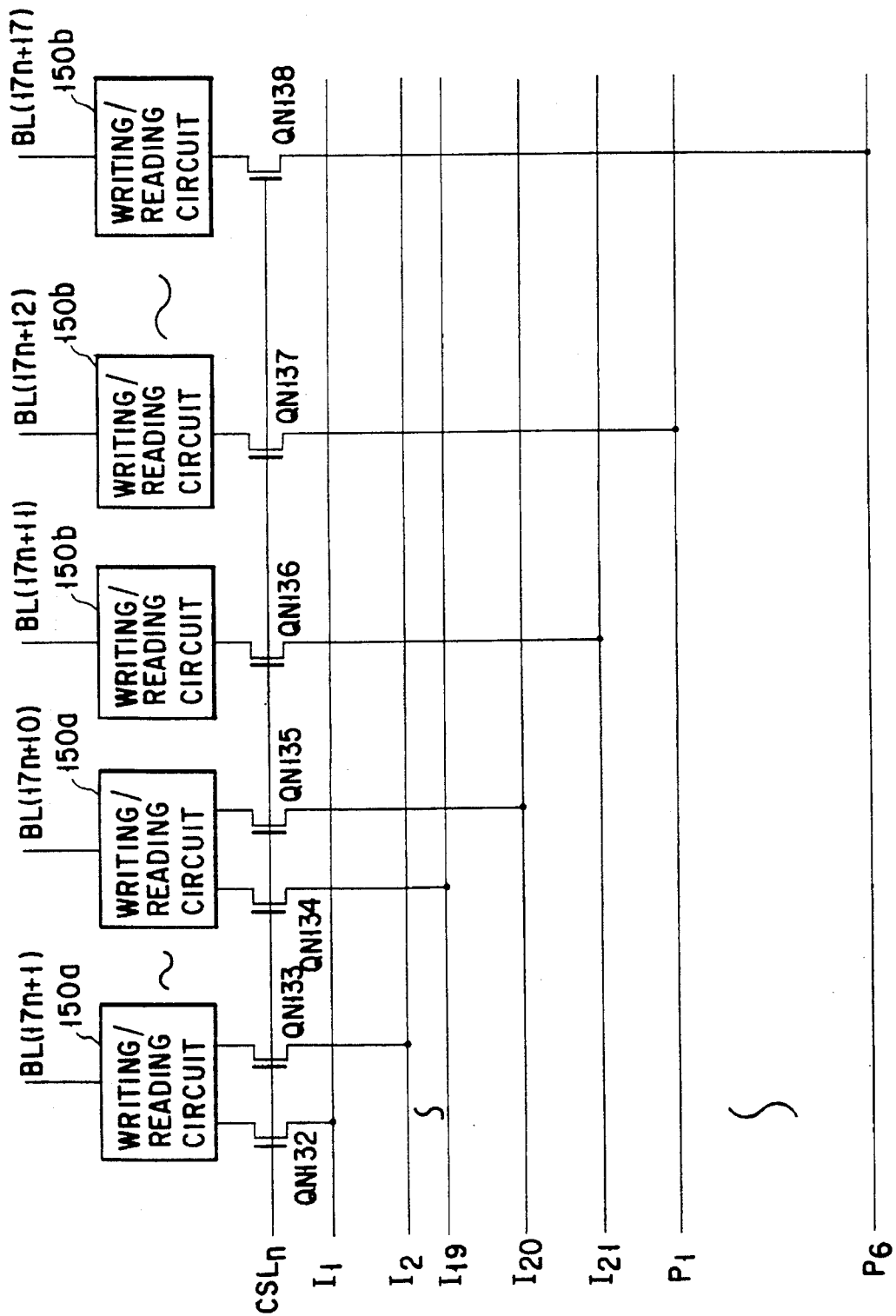
FIG. 18 is a view showing the connection relationship between lines I and P, which represent information data and check data, respectively, a writing/reading circuit 150, and bit lines.
Figure 19:
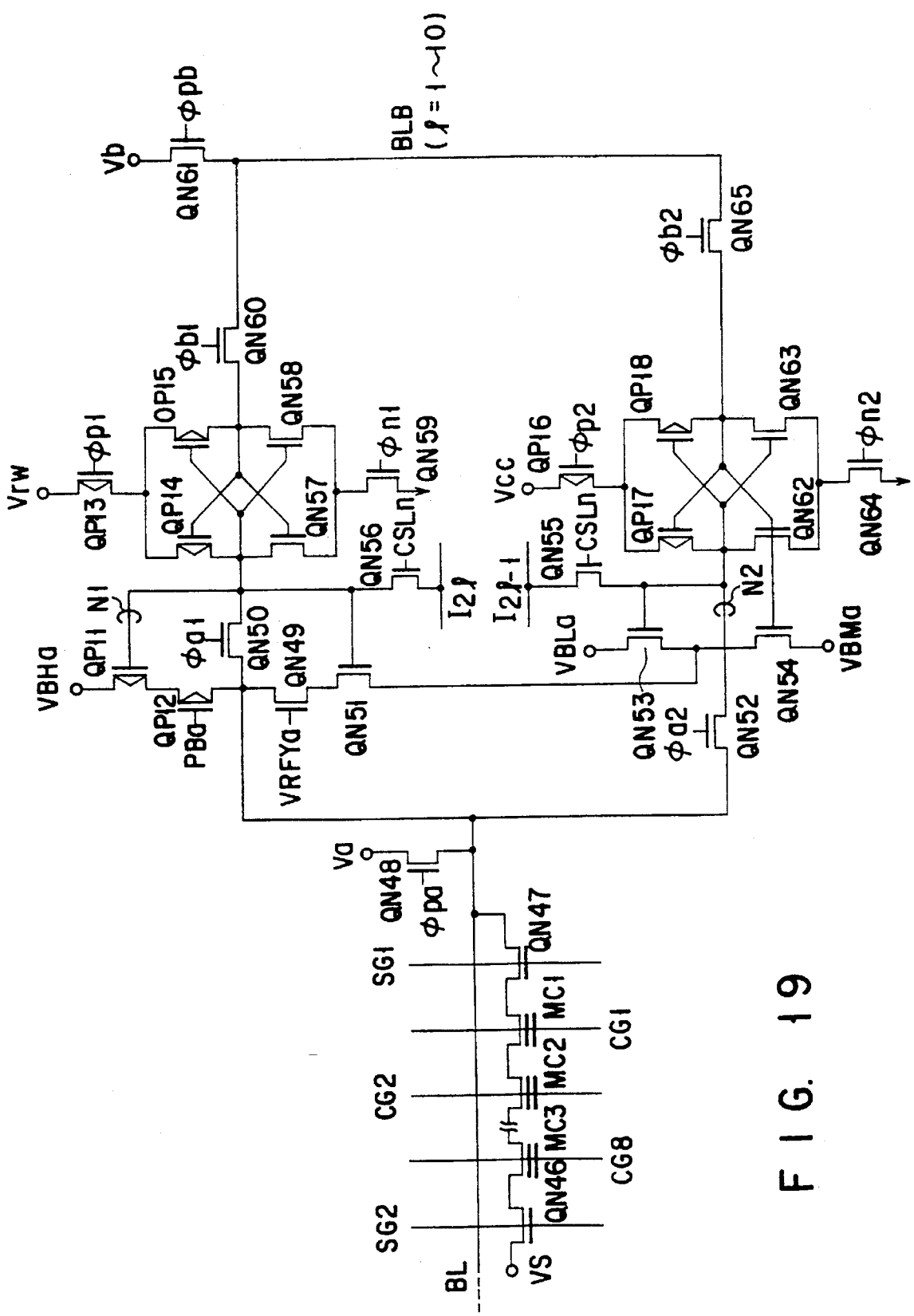
FIG. 19 is a view showing a 2-input writing/reading circuit.
Figure 20:
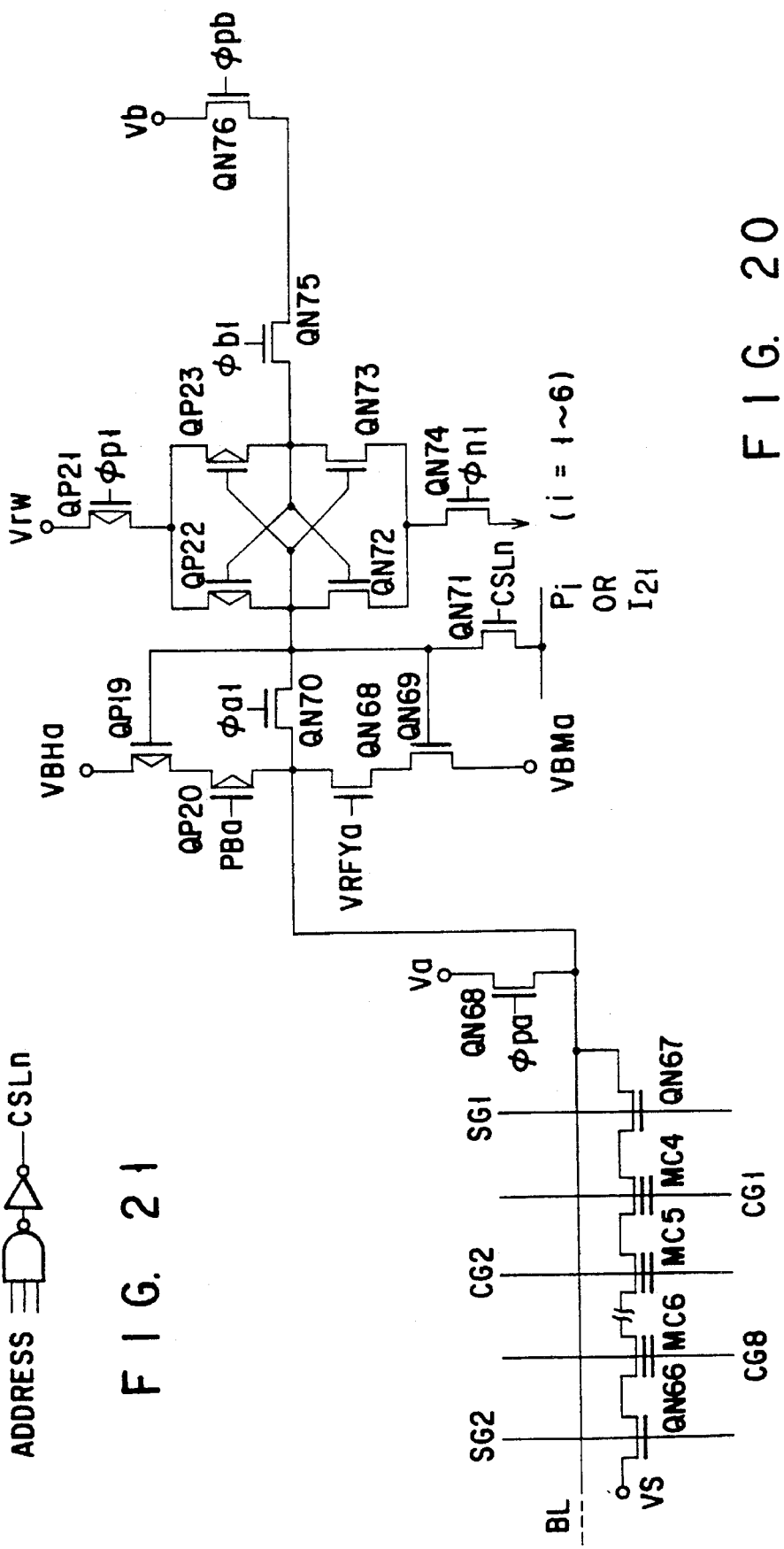
FIG. 20 is a view showing a 1-input writing/reading circuit.
Figure 21:
FIG. 21 is a view showing a column decoder.

FIG. 18 shows the connection relationship between signals I and P, which represent information and check data, respectively, the writing/reading circuit 150, and bit lines, and FIGS. 19 and 20 respectively shows a 2- and 1-input writing/reading circuits. FIG. 21 shows a column decoder.

Referring to FIG. 18, signals $I_1$ and $I_2$ are input to and output from a single writing/reading circuit 150a and connected to 1-bit line through the writing/reading circuit 150a. As shown in FIG. 18, ten 2-input writing/reading circuits 150a each shown in FIG. 19 are arranged per 20 signals I. Signals $I_{21}$ and $P_i$ (i=1 to 6) are input to and output from a 1-input writing/reading circuit 150b and connected to 1-bit line through the 1-input writing/reading circuit 150b. Therefore, the number of 1-input writing/reading circuits 150b each shown in FIG. 20 is seven. FIG. 21 shows a column decoder. Referring to FIG. 21, a signal $CSL_n$ goes to high level with respect to a selected address, and the signal $\overline{CSL}_n$ goes to low level with respect to a non-selected address.

The timings of control signals and data in the circuits shown in FIGS. 18 to 21 will be described below with reference to FIGS. 22 to 25.

First, a write-in operation will be described below.

FIG. 22 is a chart showing a timing of inputting write-in data.

When the write-in signal WE goes to high level, and the information data $O_1$ (1=1 to 16) for writing are output, the data converting circuit 110 outputs a intermediate binary code $IOO_k=IOI_k=O_k=I_k$ (k=1 to 21) for writing. At the same time, check data is generated and output as data Pi (i=1 to 6). These write-in data $I_k$ and $P_i$ are input to the input terminal of the writing/reading circuit 150 having a selected column address.

FIG. 23 is a timing chart showing, in a write-in operation, a control signal of the writing/reading circuit 150, cell selection gates SG1 and SG2, and cell control gates CG1 to CG8.

In the 2-input writing/reading circuit 150a, when write-in data is set to be "0", signals $I_{21}$ and $I_{21-1}$ are set to be 0, and internal nodes $N_1$ and $N_2$ are latched to 0. Signals ø a1, ø a2, ø pa, PBa, and VRFYa are kept at low level, and voltages VBHa, VBMa, and VBLa are set to be 8 V, 2 V, and 0 V, respectively. Therefore, in a "0" write-in operation, a voltage of 8 V is applied to a bit line BL. $N_1$=1 and $N_2$=0 are latched when the write-in data is set to be "1", and $N_1$=$N_2$=1 is latched when the write-in data is set to be "2". For this reason, in "1" and "2" write-in operations, respectively, voltages of 2 V and 0 V are applied to the bit line BL.

When a memory cell in which data is to be written is connected to the word line CG4, a voltage of 20 V is applied to the word line CG4, a voltage of 10 V is applied to the word lines CG1 to CG3 and CG5 to CG8 and the selection line SG1, and a voltage of 0 V is applied to a selection line SG2. Voltages Vg=12 V, 18 V, and 20 V are applied across the gates and channels of memory cells in which "0", "1", and "2" are to be written, respectively. When the voltage Vg=12 V is applied, a tunnel current does not flow, and the threshold voltage of the memory cell does not move and keeps to be −1 V or less. When the voltage Vg=18 V is applied, a tunnel current flows, and the threshold voltage of the memory cell moves in the positive direction, thereby setting the threshold voltage to be 0 V or more and 1 V or less. When the voltage Vg=20 V is applied, a tunnel current larger than that obtained when the voltage of Vg=18 V is applied flows, and a threshold voltage is set to be 2 V or more and 3 V or less.

As described above, ternary intermediate binary codes 00, 01, and 11 can be written in memory cells. On the other hand, the 1-input writing/reading circuit 150b is obtained by removing a second sense amplifier from the 2-input writing/reading circuit 150a. In a writing operation, voltages of 8 V and 2 V are applied to the 1-input writing/reading circuit 150 in accordance with data 0 and 1, respectively.

A reading operation will be described below with reference to FIGS. 24 and 25.

In the two-input writing/reading circuit 150a, a reading operation is performed in two steps.

In the first step, it is checked whether data is "0".

The bit BL is kept charged to 1.8 V, and a dummy bit line BLB is kept charged to 1.5 V. Thereafter, the word lines CG1 to CG3 and CG5 to CG8 except for the word line CG4 and the selection lines SG1 and SG2 are set to be 4 V. When the read-out data is "0", the charged bit line BL is discharged, and the potential of the bit line becomes less than 1.5 V. Otherwise, the potential of the bit line is kept at 1.8 V. Finally, these voltages are input to a first sense amplifier constituted by transistors QP13, QP14, QP15, QN57, QN58, and QN59, thereby amplifying the potential differences between the voltages. An internal node $N_1$=0 is latched when the read-out data is "0", and an internal node $N_1$=1 is latched when the read-out data is "1" or "2".

In the second step, it is checked whether data is "2". The second step is different from the first step only in that the word line CG4 of a memory cell from which data is to be read out is set to be 2 V. In this case, a second sense amplifier constituted by transistors QP16, QP17, QP18, QN62, QN63, and QN64 is used. An internal node $N_2$=1 is latched when the read-out data is "2", and an internal node $N_2$=0 is latched when the read-out data is "0" or "1".

As described above, ternary intermediate binary codes 00, 01, and 11 can be read out from memory cells. The 1-input writing/reading circuit 150b is activated only in the first step, and the low and high levels of the bit line potential of the 1-input writing/reading circuit 150b correspond to 0 and 1, respectively.

FIG. 25 is a chart showing timings of outputting data for reading.

Data for reading are output from the writing/reading circuit 150 of a selected column address to data $I_k$ (k=1 to 21) and $P_i$ (i=1 to 6). A syndrome $S_i$ is calculated on the basis of these 27-bit data. If the data for reading have errors, the errors are corrected, and the data for reading (intermediate binary codes) are output as $O_k=IOI_k=IOO_k$ (k=1 to 21). Finally, the data $IOO_k$ for reading is inverted into information data $IO_1$ (1=1 to 16) for reading.

As described above, according to the present invention, after the information data is converted into binary codes (intermediate binary codes), error detection/correction is performed. For this reason, a 1-bit error correction code can be applied to the present invention.

In each of the first to sixth embodiments, although a ternary memory constituted by two memory cells is considered, the present invention can be applied to a memory constituted by combining M N-value memory cells. In this case, since $N^M$ states can be set, $2^n$ ($<N^M$) states of the $N^M$ states are used, and the $2^n$ states correspond to n-bit data in a one-to-one correspondence.

The reason why the present invention can be applied to the memory obtained by combining the M N-value memory cells will be described below.

Each memory cell has two adjacent states except the states located at both the ends. The number of combinations of the adjacent states of the M memory cells are $2^M$.

For $n<2^M$, when a combination of states is changed to a adjacent combination of states, there is no corresponding relationship between the combination of the states in which informations corresponding to the adjacent combination of states are different by only 1-bit one another and this information. Therefore, with respect to the above errors, at least a 2-bit error correction code is required.

For m bits (m>=2) satisfying $2^m > N > 2^{m-1}$, when one of the N states is changed into an adjacent state, there is a corresponding relationship between an intermediate binary code and an N state in which an m-bit expression (i.e., intermediate binary code) must change by only 1-bit. This is because each cell has two adjacent states, and the number of intermediate binary codes which are different from each other by only 1-bit is m (>=2).

Therefore, when error detection/correction are performed with respect to an intermediate binary code, a 1-bit error correction code is satisfactorily used.

FIG. 26 is a schematic view showing the arrangement of a memory system according to the seventh embodiment of the present invention. The same reference numerals as in the first embodiment denote the same parts in the seventh embodiment, and a description thereof will be omitted.

The memory system according to the seventh embodiment comprises an information data storing section 210, an check data storing section 220, an error detector 40, an error corrector 50, a burst destruction position detection section 160, and a data reset section 170. The information data storing section 210 stores information data D20. The check data storing section 220 stores check data. The burst destruction position detection section 160 detects the burst destruction position of stored data of each of the storing sections. The data reset section 170 supposes the data of the burst destruction detected by the burst destruction position detection section 160 and resets the data. In the above arrangement, as in each of the first to sixth embodiments, a cell array 30 may have the information data storing section 210 and the check data storing section 220.

Figure 27:
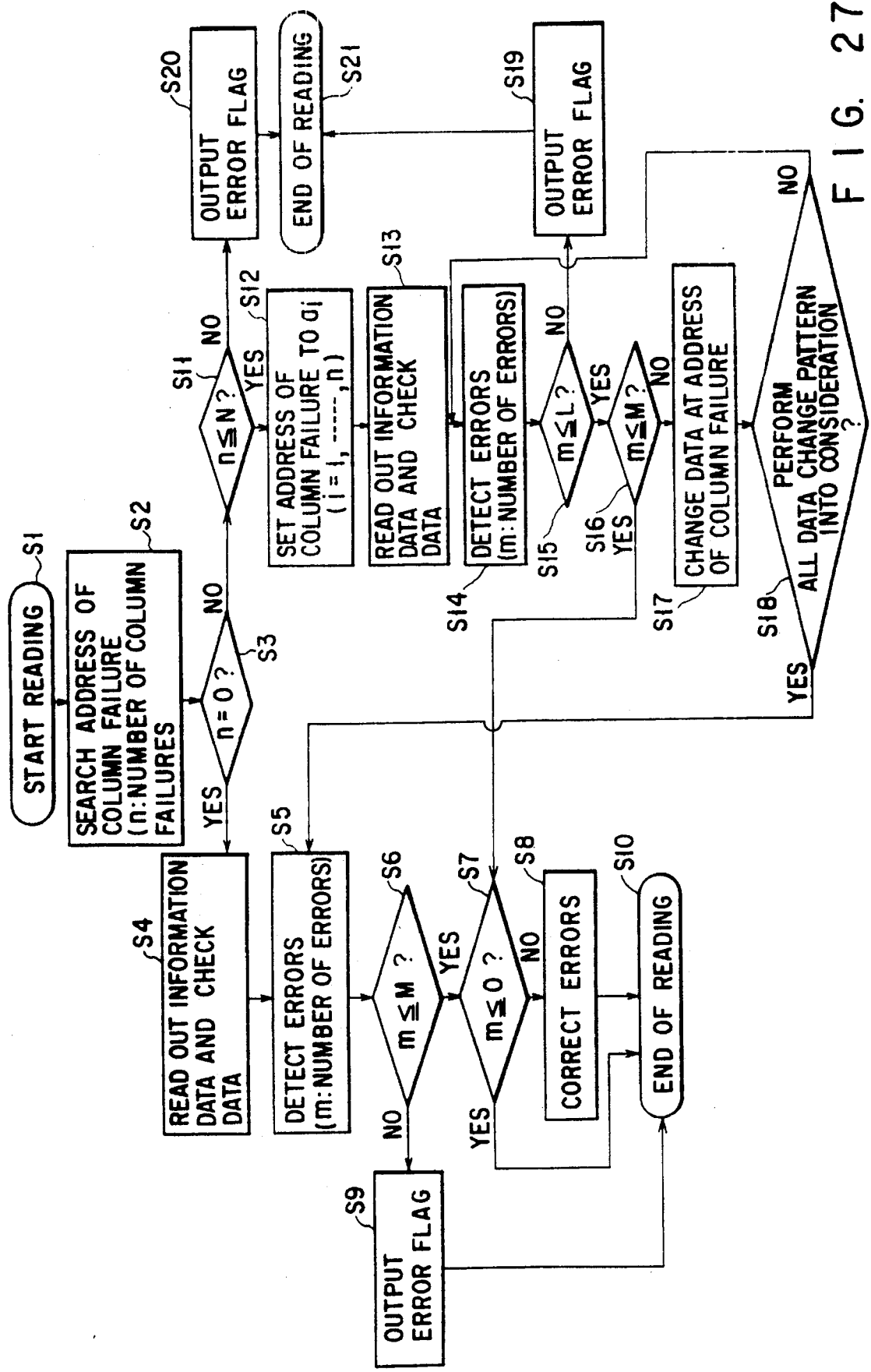
FIG. 27 is a flow chart showing an error detection/correction algorithm in the seventh embodiment of the present invention.

The operation of the memory system, arranged as described above, according the seventh embodiment will be described below with reference to FIG. 27. FIG. 27 is a flow chart showing an error detection/correction algorithm in the seventh embodiment of the present invention.

Before the details of the operations in the steps are described, the operations will be briefly described below.

A reading operation of stored data is started, the address of a column failure is searched. If no column failure is detected, the information data D20 and check data D30 are read out, and these data are input to the error detector 40 and the error corrector 50, respectively. If errors are detected, when the number of errors falls within the permissible range of the error detector 40, the error detector 40 detects the errors. At this time, when the number of errors falls within the permissible range of the error corrector 50, the error corrector 50 corrects the errors. When the number of errors is large than the maximum value in the permissible range of the error detector 40, the error detector 40 probabilistically detects the errors. Up to this operation, the read-out operation is ended.

When a column failure occurs, a pointer is set at the address of this failure column. Thereafter, the information data D20 and the check data D30 are read out, and these data are input to the error detector 40. When the number of errors falls within the permissible range of the error detector 40, error detection/correction is executed as in each of the above embodiments. When the number of errors falls out of the permissible range of the error detector 40, data at the address of a failure column is changed, and the changed data is input to the error detector 40 again.

In accordance with the relationship between the number of errors and the number of errors which can be detected by the error detector 40, the above algorithm is repeated until a change in data at the address of the failure column is performed for all possible patterns. In any pattern, when the number of errors falls within the permissible range of the error detector 40, and the number of errors falls outside the permissible range of the error corrector 50, an error flag for informing that errors have occurred is output.

The contents of the steps shown in FIG. 27 will be briefly described.

A reading operation is started (step S1). The address of a column failure is searched (step S2). In this case, the number of errors is set to be n.

It is checked (step S3) whether n is zero, i.e., column failures are detected. If YES in step S3, the flow advances to step S11. If NO in step S3, the flow advances to step S4.

The information data D20 and the check data D30 are read out (step S4). Error detection is performed, and the number of errors obtained at this time is set to be m (step S5).

It is checked (step S6) whether the number of errors obtained in step S5 is equal to or smaller than the number M of correctable errors. If YES in step S6, the flow advances to step S7. If NO in step S6, the flow advances to step S9.

It is checked (step S7) whether the number of errors is zero. If YES in step S7, the flow advances to step S10 to end reading (step S10). If NO in step S7, the flow advances to step S8 to correct the errors (step S8).

If NO in step S6, an error flag for informing that incorrectable errors have been detected is output (step S9), and reading is ended (step S10).

If it is determined in step S3 that column failures are detected, it is checked (step S11) whether the number of column failures is equal to or smaller than the number N of permissible column failures. If YES in step S11, the flow advances the step S12, and addresses $a_i$ of the failure column are output. If NO in step S11, the flow advances the step S20, and an error flag for informing that incorrectable errors have been detected is output (step S20), and reading is ended (step S21).

The information data D20 and the check data D30 are read out (step S13). Error detection is performed, and the number of errors obtained at this time is set to be m (step S14).

It is checked (step S15) whether the number of errors obtained in step S14 is equal to or smaller than the number L of perfectly detectable errors. If YES in step S15, the flow advances to step S16 to check whether the number of errors is equal to or smaller than the number of correctable errors (step S16). If NO in step S15, the flow advances to step S19 to output an error flag for informing that incorrectable errors have been detected (step S19). Reading is ended (step S21).

If YES in step S16, the flow advances to step S7. If NO in step S16, the flow advances to S17 to change data at the address of the failure column (step S17).

It is checked (step S18) whether a data change at the failure column address in step S17 is performed to all possible patterns. If YES in step S18, the flow advances to step S5. Otherwise, the flow is returned to step S14.

In the above flow chart, the number N of failure columns is desirably set to be the number L of perfectly detectable errors or less. N=L−M or N=1 is generally satisfied.

Figure 28:
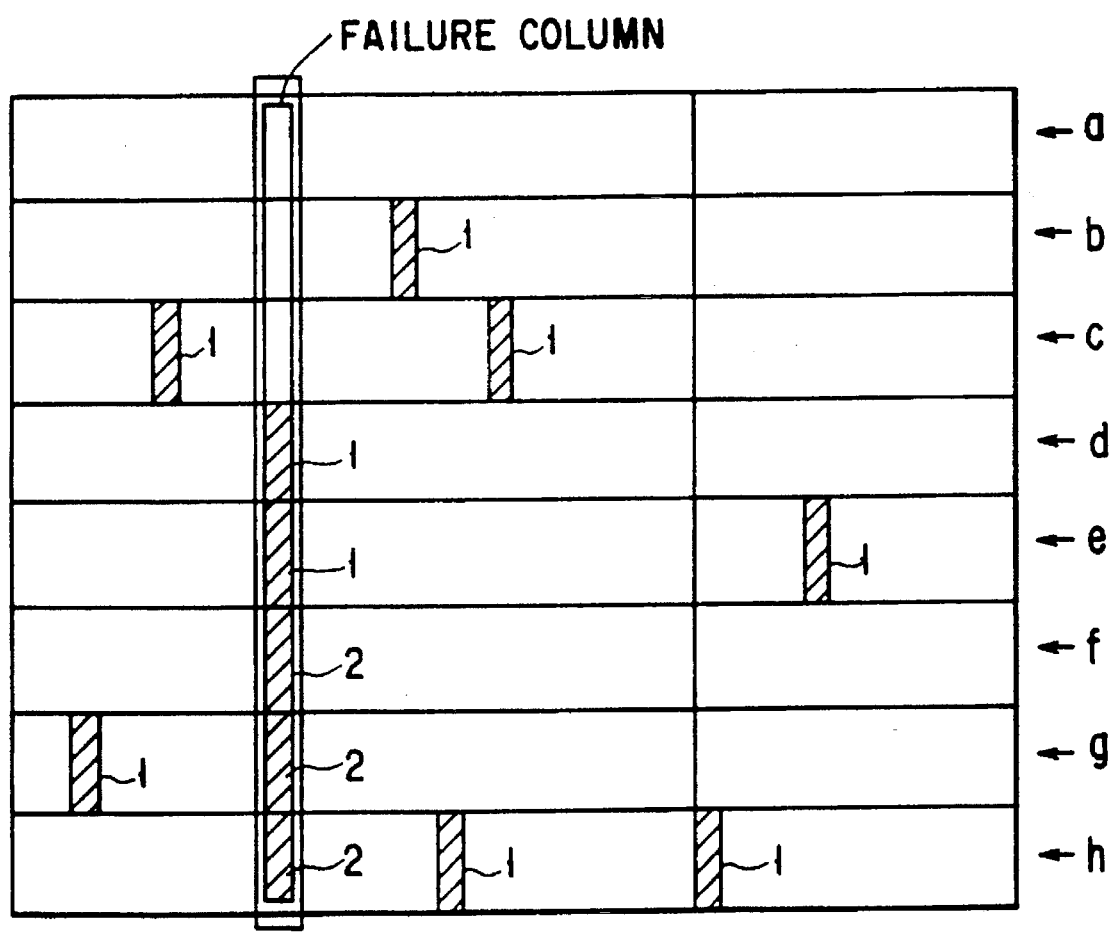
FIG. 28 is a block diagram showing a failure in the seventh embodiment of the present invention.

FIG. 28 is a block diagram showing a failure in the seventh embodiment. In FIG. 28, an error occurs in a memory cell in which a hatched portion is located, and a numerical value of each hatched portion indicates the size of the error of a corresponding one of the hatched portions. A case wherein a 1-bit error correction/2-bit error detection code is applied as an example will be described below.

In reading out data from row a, since row a has no error, the data is correctly read out from row a without any change.

In reading out data from rows b and d, since each of rows b and d has only one error, each error is corrected by the error corrector 50.

In reading out data from row c, since row c has two errors, these errors are detected by the error detector 40.

In reading out data from row e, since row e has one error on a failure column and one error outside the failure column, these errors are detected by the error detector 40. Thereafter, the data on the failure column is converted into possible data, and row e has only the error except for the failure column as an error serving as original write-in data. In this case, this data is corrected by the error corrector 50.

In reading out data from row f, since an error having a size of 2 is located on the failure column, this error is detected by the error detector 40. Thereafter, as in row e, error data is corrected by the error corrector 50.

In reading out from row g, row g has an error, having a size of 2, on the failure column and one error, having a size of 1, except for the failure column. In this case, these errors are probabilistically detected by the error detector 40. When the errors are detected, as in row f, error data are corrected by the error corrector 50.

In reading out data from row h, row h has one error, having a size of 2, on the failure column and two or more errors except for the failed column. In this case, although these errors are probabilistically detected by the error detector 40, the errors are not corrected.

Table 8 shows the relationship between the number of information bits and the number of check bits when ternary data are used.

TABLE 8

| Number of Information Data | Number of Inspection Data | | |
|---|---|---|---|
| | S2EC-D2ED is applied to Binary Expression Multi-Value Data | S3EC-D3ED is applied to Information Data | SEC-DED is applied to Binary Expression Multi-Value Data |
| ... | ... | ... | ... |
| 16 | 10(10) | 9(6) | 6(6) |
| 32 | 12(12) | 12(8) | 7(7) |
| 64 | 12(12) | 15(10) | 8(8) |
| 128 | 14(14) | 15(10) | 9(9) |
| ... | ... | ... | ... |

Table 8 shows a case wherein a single 2-bit byte error correction/double 2-bit byte error detection code is applied as a binary code, and a case wherein a single 3-bit byte error correction/double 3-bit byte error correction code is applied as true data, and a 1-bit error correction/2-bit error detection code is applied as a binary code according to the present invention. As is apparent from Table 8, the number of check data can be minimized with respect to the number of information data when a 1-bit error correction/2-bit error detection code is applied as the binary code according to the present invention. Each numerical value in the parentheses in Table 8 represents the number of memory cells with respect to the number of check data.

The present invention is not limited to the above embodiments, and various changes and modifications of the present invention can be effected without departing from the spirit and scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A memory system comprising:

storing means having a plurality of memory elements each of which stores one of n-value storage states corresponding to data "0", "1", ..., "n−1", said storing means including a plurality of information memory elements for storing n-value information data and a plurality of check memory elements for storing check data;

converting means for respectively converting the information data and the check data stored in said plurality of memory elements into binary codes having a plurality of bits each constituted by 0 or 1, the binary codes corresponding to the information data and the check data; and detecting/correcting means for detecting and correcting an error on the basis of said binary codes corresponding to the check data and the information data.

2. A system according to claim 1, wherein said converting means includes means for converting the information data and check data into binary codes including intermediate binary codes which are combinations of binary codes each of which data is stored in one of said plurality of memory elements.

3. A system according to claim 1, wherein said storing means stores the n-value information data by combinations of said plurality of memory elements.

4. A system according to claim 1, wherein said information memory element includes
- a second converting means for causing said check memory element to generate a binary code corresponding to data to be stored in one of said plurality of memory elements, and
- writing means for causing said plurality of memory elements to perform n-value storage on the basis of the binary code.

5. A system according to claim 1, wherein said converting means includes means for converting storage data of a memory element into a binary code having a plurality of bits each constituted by 0 or 1, and
- said detecting/correcting means includes means for detecting/correcting an error on the basis of information data and check data and outputting a data code represented by combinations of data of said plurality of memory elements on the basis of the binary code.

6. A system according to claim 5, further comprising means for generating a binary code corresponding to data to be stored in said plurality of said check memory elements on the basis of the binary code converted from the data code and corresponding to data to be stored in said plurality of said information memory elements to cause said plurality of information memory elements to perform n-value storage on the basis of the binary code.

7. A system according to claim 1, wherein said converting means includes means for converting data such that, when a size of data in said plurality of memory elements changes by one, a binary code of the data has a Hamming distance of 1, for that of the data whose size in said plurality of memory elements is different by one.

8. A system according to claim 1, wherein said plurality of memory elements perform n-value storage using charge amounts stored in said plurality of memory elements and correspond to n data "0", "1", ..., "n−1" in an order of magnitudes of the charge amounts.

9. A system according to claim 1, wherein said plurality of memory elements is a nonvolatile memory cell obtained by stacking and forming a charge storage layer and a control gate on a semiconductor layer.

10. A system according to claim 1, wherein a storage state of said plurality of memory elements is changed by one.

11. A system according to claim 1, wherein said storing means stores n-bit ($2^n < N^M < 2^{n+1}$) information having a relation $n < 2^M$ using combinations of said M (M: an integer of not less than 2) and N-value (N: an integer of not less than 3) memory elements.

12. A memory system comprising:
- an EEPROM including a plurality of first memory cells each of which stores information data selected from at least three storage states and a plurality of second memory cells each of which stores check data selected from at least three storage states;
- a converter for converting the information data stored in said first memory cells and check data stored in said second memory cells into binary codes, respectively, each of said binary codes having a plurality of bits each constituted by 0 or 1;
- detecting/correcting means for detecting and correcting an error by using the converted binary codes of the information data and the check data.

13. A memory system according to claim 12, wherein said binary codes including intermediate binary code and said detecting/correcting means for detecting and correcting an error by using the converted intermediate binary codes of the information data and the check data.

14. A memory system comprising:
- memory cells each of which stores one of N-levels, where N is an integer of not less than 3;
- inverting means for inverting M-sets of an intermediate binary code into data composed of n-bits, where M is an integer of not less than 2 and n is an integer satisfied with a relation of $2^n < N^M < 2^{n+1}$, and there is one to one correspondence between the intermediate binary code and the N-levels; and
- reading means for reading the M-sets of an intermediate binary code from N memory cells.

15. A system according to claim 14, wherein said N-levels correspond to said intermediate binary code such that the difference between the intermediate binary code corresponding to one level and that corresponding to the neighboring level is only one digit.

16. A system according to claim 15, wherein said level is given by a magnitude of charge amounts.

17. A system according to claim 16, wherein said memory cell is obtained by stacking and forming a charge storage layer and control gate on a semiconductor layer.

18. A system according to claim 14, wherein N is 3, M is 2 and n is 3.

19. A system according to claim 14, comprising:
- converting means for converting the information data into binary codes including intermediate binary codes which are combinations of binary codes each of which data is stored in one of said plurality of memory cells.

20. A system according to claim 14, wherein said storing means stores the n-value information data by combinations of said plurality of memory cells.

21. A system according to claim 14, wherein said memory cells include information memory cells and check memory cells, comprising:
- converting means for causing said check memory cells to generate a binary code corresponding to data to be stored in one of said plurality of memory cells, and
- writing means for causing said plurality of memory cells to perform n-value storage on the basis of the binary code.

22. A system according to claim 14, comprising:
- converting means for converting data such that, when a size of data in said plurality of memory cells changes by one, a binary code of the data has a Hamming distance of 1, for that of the data whose size in said plurality of memory cells is different by one.

23. A system according to claim 14, wherein said plurality of memory cells perform n-value storage using charge amounts stored in said plurality of memory cells and correspond to n data "0", "1", ..., "n−1" in an order of magnitudes of the charge amounts.

24. A system according to claim 14, wherein said plurality of memory cells are nonvolatile memory cells obtained by stacking and forcing a charge storage layer and a control gate on a semiconductor layer.

25. A system according to claim 14, wherein a storage state of said plurality of memory cells is changed by one.

26. A system according to claim 14, wherein said memory cells store n-bit ($2^n < N^M < 2^{n+1}$) information having a relation $n < 2^M$ using combinations of said M (M: an integer of not less than 2) and N-value (N: an integer of not less than 3) memory cells.

27. A system according to claim 14, further comprising error checking and correcting means for checking and correcting data composed of one or plural sets of an intermediate binary code.

28. A system according to claim 27, wherein said N-levels correspond to said intermediate binary code such that the difference between the intermediate binary code corresponding to one level and that corresponding to a neighboring level is only one digit.

29. A system according to claim 28, wherein said level is given by a magnitude of charge amounts.

30. A system according to claim 29, wherein said memory cells are obtained by stacking and forming a charge storage layer and control gate on a semiconductor layer.

31. A system according to claim 27, wherein N is 3, M is 2 and n is 3.

32. A system according to claim 14, further comprising:

converting means for converting data composed of three bits into two sets of an intermediate binary code, in which there is one to one correspondence between the intermediate binary code and the levels;

check data generating means for generating check data from data composed of one or plural sets of an intermediate binary code; and error checking and correcting means for checking and correcting data composed of one or plural sets of the intermediate binary code.

33. A system according to claim 32, wherein said N-levels correspond to said intermediate binary code such that the difference between the intermediate binary code corresponding to one level and that corresponding to the neighboring level is only one digit.

34. A system according to claim 33, wherein said level is given by a magnitude of charge amounts.

35. A system according to claim 34, wherein said memory cells are obtained by stacking and forming a charge storage layer and control gate on a semiconductor layer.

36. A system according to claim 32, wherein N is 3, M is 2 and n is 3.

37. A memory system comprising:

memory cells each of which stores one of N-levels, where N is an integer of not less than 3;

converting means for converting data composed of n-bits into M-sets of an intermediate binary code, where M is an integer of not less than 2 and n is an integer satisfied with a relation of $2^n < N^M < 2^{n+1}$, and there is one to one correspondence between the intermediate binary code and the N-levels;

writing means for writing the M-sets of an intermediate binary code into M memory cells;

reading means for reading the M-sets of an intermediate binary code into M memory cells; and inverting means for inverting the M-sets of an intermediate binary code into the data composed of n-bits.

38. A system according to claim 37, wherein said N-levels correspond to said intermediate binary code such that the difference between the intermediate binary code corresponding to one level and that corresponding to the neighboring level is only one digit.

39. A system according to claim 38, wherein said level is given by a magnitude of charge amounts.

40. A system according to claim 39, wherein said memory cells are obtained by stacking and forming a charge storage layer and control gate on a semiconductor layer.

41. A system according to claim 37, wherein N is 3, M is 2 and n is 3.

* * * * *